US007629210B2

(12) United States Patent
Okushima

(10) Patent No.: US 7,629,210 B2
(45) Date of Patent: *Dec. 8, 2009

(54) METHOD FOR FABRICATING AN ESD PROTECTION APPARATUS FOR DISCHARGING ELECTRIC CHARGE IN A DEPTH DIRECTION

(75) Inventor: Mototsugu Okushima, Tokyo (JP)

(73) Assignee: NEC Corporation, Tokyo (JP)

( * ) Notice: Subject to any disclaimer, the term of this patent is extended or adjusted under 35 U.S.C. 154(b) by 306 days.

This patent is subject to a terminal disclaimer.

(21) Appl. No.: 11/649,211

(22) Filed: Jan. 4, 2007

(65) Prior Publication Data

US 2007/0194380 A1 Aug. 23, 2007

Related U.S. Application Data

(60) Continuation-in-part of application No. 11/442,288, filed on May 30, 2006, now Pat. No. 7,294,542, which is a division of application No. 09/852,735, filed on May 11, 2001, now abandoned.

(30) Foreign Application Priority Data

May 15, 2000 (JP) ............................. 2000-141304
Apr. 19, 2001 (JP) ............................. 2001-120739

(51) Int. Cl.
H01L 21/8238 (2006.01)
(52) U.S. Cl. ....................... 438/199; 438/200; 438/202; 257/355
(58) Field of Classification Search ......... 438/199–200, 438/202–203, 322, 328; 257/355, 369, E21.382–E21.385, 257/E21.695–E21.696
See application file for complete search history.

(56) References Cited

U.S. PATENT DOCUMENTS

| 5,043,782 A | 8/1991 | Avery |
| 5,272,371 A | 12/1993 | Bishop et al. |
| 5,276,582 A | 1/1994 | Merrill et al. |
| 5,471,082 A | 11/1995 | Maeda |
| 5,539,327 A | 7/1996 | Shigehara et al. |

(Continued)

FOREIGN PATENT DOCUMENTS

JP          61-232657          10/1986

(Continued)

OTHER PUBLICATIONS

Adel S. Sedra, Kenneth C. Smith, Microelectronic Circuits, Holt, Rinehart and Winston, 1987, pp. 408-410.

(Continued)

Primary Examiner—Theresa T Doan
(74) Attorney, Agent, or Firm—Young & Thompson

(57) ABSTRACT

To make electric current concentration and electric field concentration hardly take place in junction parts even in case of performing miniaturization and to achieve triggering at low voltage. An ESD protection apparatus is installed between an input terminal 6 of a semiconductor integrated circuit chip and a CMOS transistor 100 and includes a trigger element 310 comprising diodes 311, 312 which are broken down by overvoltage applied to the input terminal 6 and an ESD protection element 210 including longitudinal bipolar transistors 211, 212 for discharging the accumulated electric charge of the input terminal 6 by being electrically communicated owing to the breakdown of the diodes 311, 312.

13 Claims, 38 Drawing Sheets

U.S. PATENT DOCUMENTS

| | | | |
|---|---|---|---|
| 5,623,387 A | | 4/1997 | Li et al. |
| 5,648,676 A | | 7/1997 | Iwai et al. |
| 5,774,318 A | | 6/1998 | McClure et al. |
| 5,821,797 A | | 10/1998 | Kinugasa et al. |
| 5,976,921 A | * | 11/1999 | Maeda .................. 438/202 |
| 7,294,542 B2 | * | 11/2007 | Okushima ............... 438/199 |

FOREIGN PATENT DOCUMENTS

| | | |
|---|---|---|
| JP | 61-251165 | 11/1986 |
| JP | 62-242354 | 10/1987 |
| JP | 02-199868 | 8/1990 |
| JP | 02-244752 | 9/1990 |
| JP | 05-259394 | 10/1993 |
| JP | 06-163841 | 6/1994 |
| JP | 06-335162 | 12/1994 |
| JP | 09-213891 | 8/1997 |
| JP | 10-242400 | 9/1998 |
| JP | 11-168183 | 6/1999 |
| JP | 11-251533 | 9/1999 |
| KR | 1996-0014444 | 10/1996 |
| KR | 1999-30302 | 4/1999 |

OTHER PUBLICATIONS

Avalanche Injection and Second Breakdown in Transistors, P. Hower et al. IEEE Transactions on Electron Devices, vol. Ed-17, No. 4, Apr. 1970.

* cited by examiner

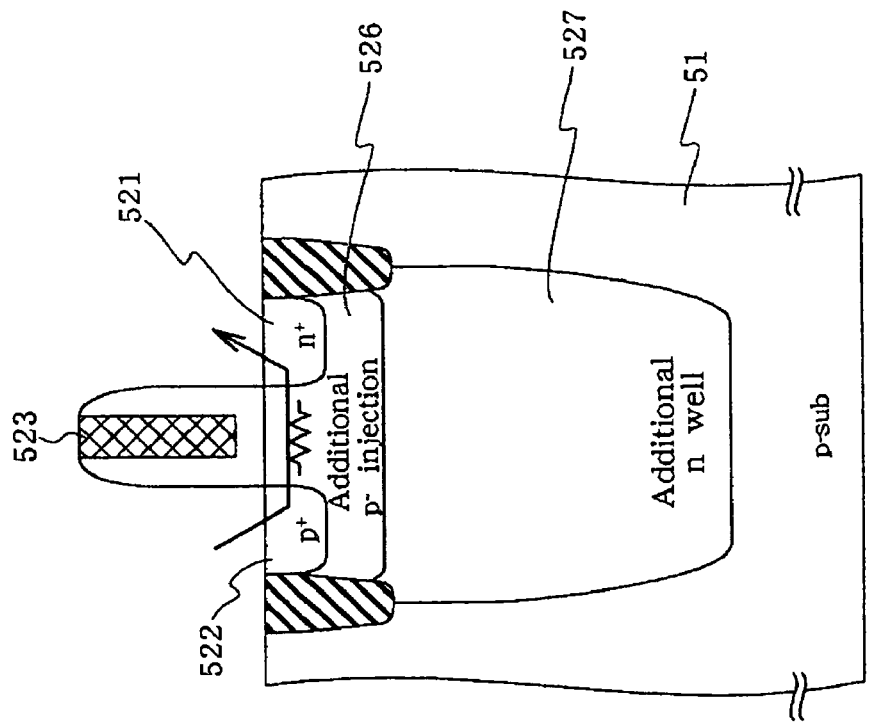
FIG.32(b) DIODE UTILIZING ONE PORTION OF LONGITUDINAL BIPOLAR TRANSISTOR
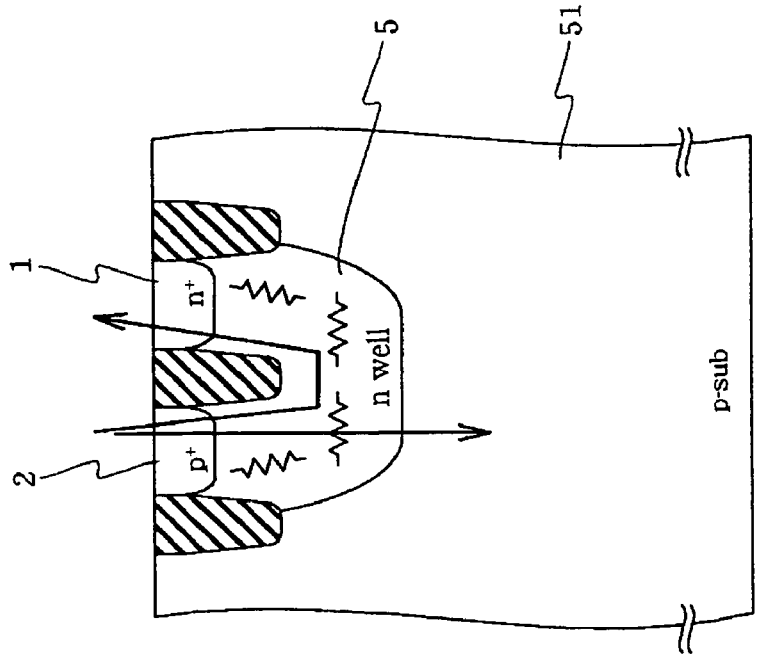
FIG.32(a) DIODE COMPRISING p+LAYER/n well FABRICATED BY EXISTING CMOS PROCESS

METHOD FOR FABRICATING AN ESD PROTECTION APPARATUS FOR DISCHARGING ELECTRIC CHARGE IN A DEPTH DIRECTION

CROSS-REFERENCE TO RELATED APPLICATIONS

This is a continuation-in-part of application Ser. No. 11/442,288, filed May 30, 2006, which is a division of application Ser. No. 09/852,735, filed May 11, 2001, which claims priority under 35 U.S.C. §119 of the filing dates of Japanese Application Nos. 2000-141304, filed May 15, 2000, and 2001-120739, filed Apr. 19, 2001, the entire disclosures of which above-noted applications are hereby incorporated by reference.

BACKGROUND OF THE INVENTION

1. Field of the Invention

The present invention relates to an ESD protection apparatus to be installed in a semiconductor integrated circuit chip in order to protect a semiconductor integrated circuit from electrostatic discharge (ESD) and to a method for fabricating the protection apparatus.

2. Description of the Prior Art

A conventional ESD protection apparatus in the CMOS process generally protects a semiconductor integrated circuit using a MOSFET transverse parasitic bipolar transistor by releasing the electric current in the transverse direction in a silicon substrate. On the other hand, the ESD protection apparatus has been required to be further miniaturized since the number of pins to be mounted on one chip has been increased sharply following the recent acute requirement of development of semiconductor integrated circuits made finer.

BRIEF SUMMARY OF THE INVENTION

Object of the Invention

However, as the miniaturization has been proceeding further, the electric current concentration and electric field concentration upon the junction parts has been increased more, so that the ESD protection apparatus has sometimes been broken owing to the heat generation. Therefore, there has been a limit to further improve the capability of the ESD protection apparatus. Further, the gate insulation film of a CMOS transistor has recently been made thinner, so that the gate insulation film sometimes has been broken before the ESD protection apparatus starts operating (reference to FIG. 38). Consequently, it has highly been expected to develop the ESD protection apparatus capable of triggering at a lower voltage.

Hence, the present invention aims to provide an ESD protection apparatus in which electric current concentration and electric field concentration upon the junction parts hardly take place even if miniaturization is advanced and which is capable of triggering at a lower voltage and to provide a method for fabricating such an ESD protection apparatus.

SUMMARY OF THE INVENTION

A method of fabricating a semiconductor integrated circuit device according to the present invention comprises the steps of: (a) simultaneously forming a first conductivity type well of a second conductivity type MOS transistor for an inner circuit and a first conductivity type collector connection well to be connected with a collector of a vertical bipolar transistor on a second conductivity type semiconductor substrate; (b) forming a first conductivity type collector well to be a collector of said vertical bipolar transistor; (c) forming a second conductivity type layer to be a base in the first conductivity type collector well of said vertical bipolar transistor; (d) simultaneously forming a first conductivity type well contact region in the first conductivity type well of said second conductivity type MOS transistor, a first conductivity type layer to be a collector connection in the first conductivity type collector connection well of said vertical bipolar transistor, and a first conductivity type layer to be an emitter in the second conductivity type layer of said vertical bipolar transistor; (e) simultaneously forming a second conductivity type source/drain layer on the first conductivity type well of said second conductivity type MOS transistor, and a second conductivity type base contact layer on the second conductivity type layer of said vertical bipolar transistor; and (f) forming a first conductivity type layer between said first conductivity type collector connection well and said first conductivity type layer to be a collector connection so as to alleviate a high intensity of electric field between said first conductivity type collector connection well and said first conductivity layer collector connection.

In the above-described method, said second conductivity type MOS transistor may be a PMOS transistor, and said vertical bipolar transistor may be a vertical NPN transistor.

Also, a method of fabricating a semiconductor integrated circuit device according to the present invention further comprises the step of: (g) forming a second conductivity type well of a first conductivity type MOS transistor for said inner circuit.

Further, step (d) comprises simultaneously forming a first conductivity type layer on the second conductivity type well of said first conductivity type MOS transistor, and step (e) comprises simultaneously forming a second conductivity type well contact region in the second conductivity type well of said first conductivity type MOS transistor.

A method of fabricating a semiconductor integrated circuit device according to the present invention comprises the steps of: simultaneously forming an N⁻ type well of a CMOS transistor comprising an inner circuit and an N⁻ type well for collector connection to be connected with a collector of a vertical bipolar transistor on a P type semiconductor substrate; simultaneously forming a collector N⁻ type well to be a collector of said vertical bipolar transistor and an N⁻ type well of a diode on said P type semiconductor substrate; simultaneously forming a P⁻ type layer to be a base in the collector N⁻ type well of said vertical bipolar transistor and a P⁻ type layer to be an anode in the N⁻ type well of said diode; simultaneously forming an N⁺ type layer in the P⁻ type well of said CMOS transistor, an N⁺ type layer in the N⁻ type well for collector connection of said vertical bipolar transistor, an N⁺ type layer to be an emitter in the P⁻ type layer of said vertical bipolar transistor, and an N⁺ type layer to be a cathode in the P⁻ type layer of said diode; simultaneously forming a P⁺ type layer on the N⁻ type well of said CMOS transistor, a P⁺ type layer on the P⁻ type layer of said vertical bipolar transistor, and a P⁺ type layer on the P⁻ type layer of said diode; and forming an N type layer between said N type collector connection well and said N⁺ type layer to be a collector connection so as to alleviate a high intensity of electric field between said first conductivity type collector connection well and said first conductivity layer collector connection.

BRIEF DESCRIPTION OF THE DRAWINGS

FIG. 32A is a cross-sectional view showing a diode comprising a $P^+$ layer/an N well formed in the existing CMOS process in the eighth embodiment;

FIG. 32B is a cross-sectional view showing one portion of the vertical bipolar transistor in the tenth embodiment;

DETAILED DESCRIPTION OF THE PREFERRED EMBODIMENTS

Figure 1:
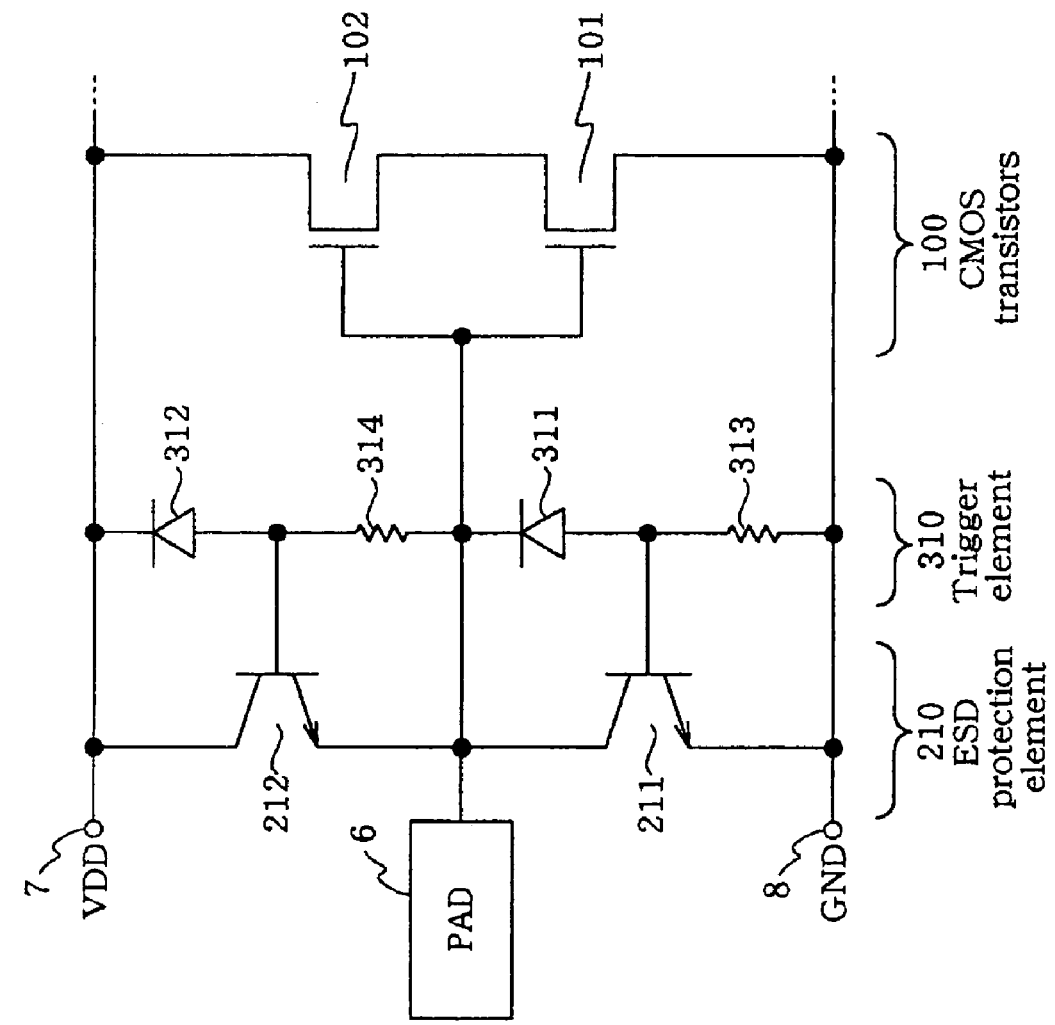
FIG. 1 is a circuit diagram illustrating a first embodiment of an ESD protection apparatus of the present invention.
Figure 2:
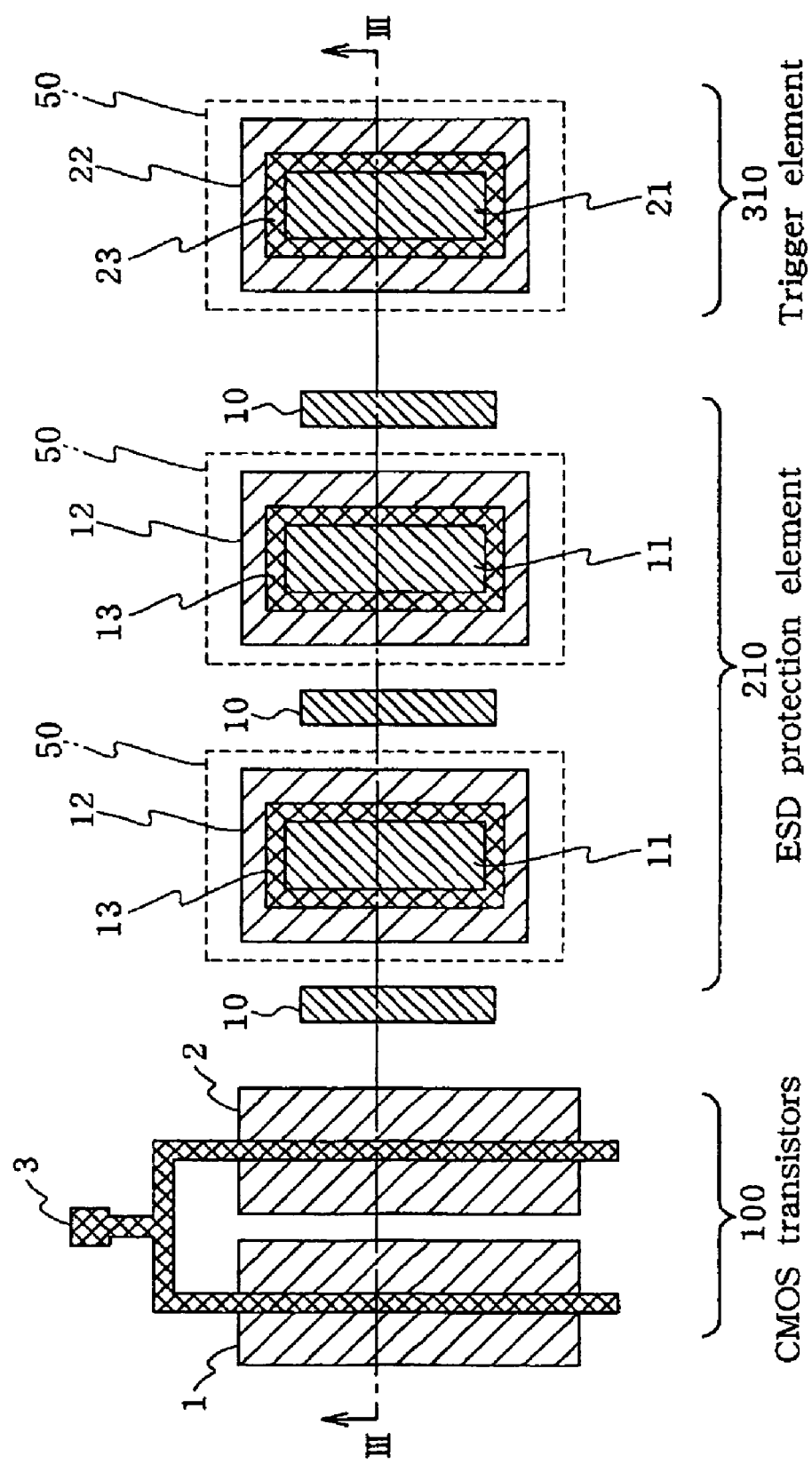
FIG. 2 is a plan view of the ESD protection apparatus of FIG. 1.
Figure 3:
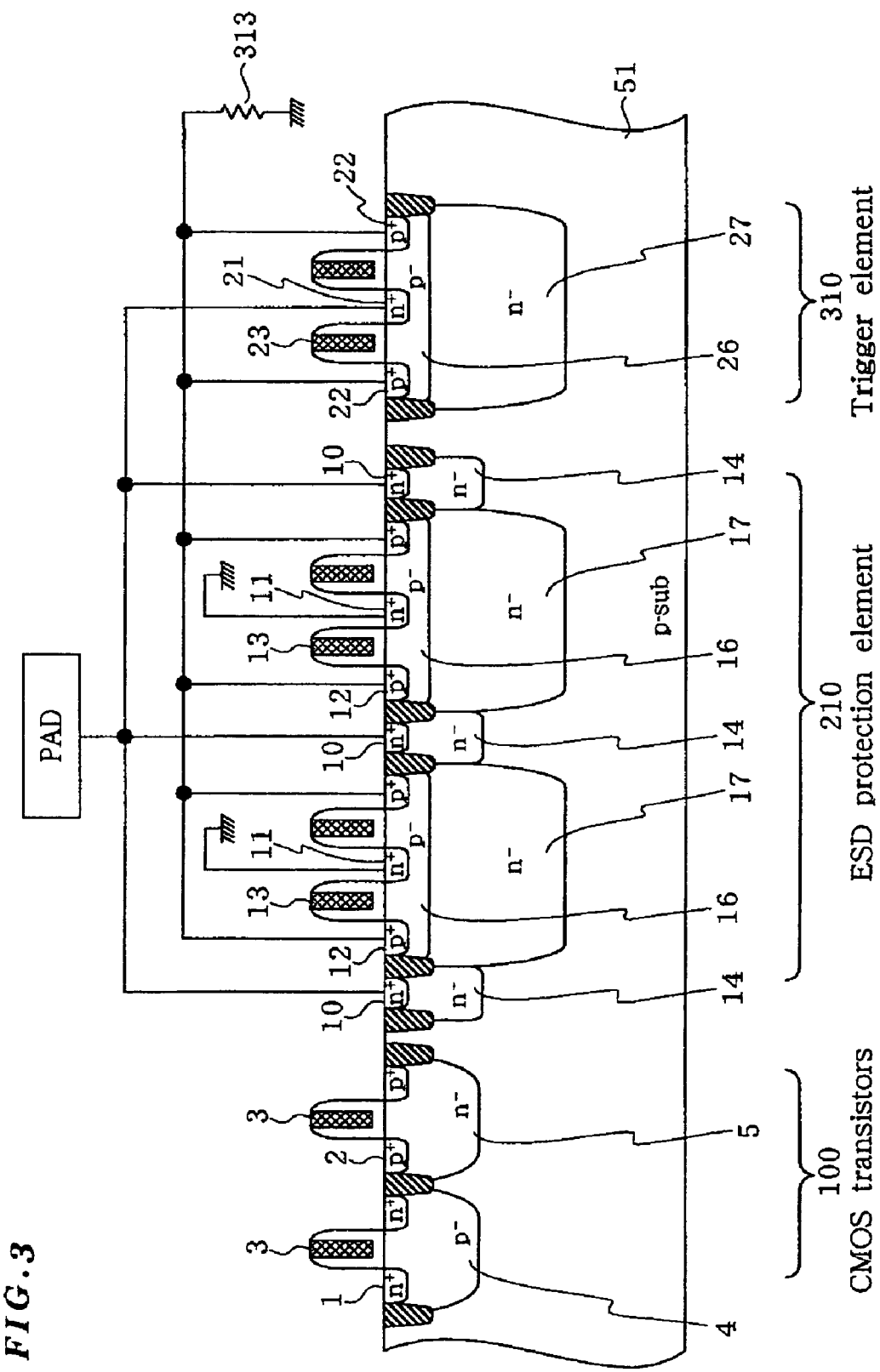
FIG. 3 is a vertical cross-section figure cut along the III-III line in FIG. 2.

FIG. 1 to FIG. 3 illustrates a first embodiment of an ESD protection apparatus relevant to the present invention and FIG. 1 is a circuit diagram, FIG. 2 is a plan view, and FIG. 3 is a vertical cross-section figure along the III-III line in FIG. 2. Hereinafter, description will be given with reference to these figures. The ESD protection apparatus of this embodiment works as an input buffer protection circuit.

The ESD protection apparatus of this embodiment is installed between an input terminal (an input pad) 6 of a semiconductor integrated circuit chip and a CMOS transistor 100 and comprises a trigger element 310 comprising diodes 311, 312 which are broken down by overvoltage applied to the input terminal 6 and an ESD protection element 210 comprising vertical bipolar transistors 211, 212 for discharging the accumulated electric charge of the input terminal 6 by being electrically communicated owing to the breakdown of the diodes 311, 312. Incidentally, FIG. 2 and FIG. 3 show only the vertical bipolar transistor 211 as some of ESD protection element 210 and only the diode 311 as some of the trigger element 310.

The CMOS transistor 100 is a CMOS inverter comprising an NMOS transistor 101 and a PMOS transistor 102. Regarding the diode 311, the cathode is connected with the input terminal 6 and the anode is connected with the base of the vertical bipolar transistor 211. Regarding the diode 312, the cathode is connected with an electric power terminal 7 and the anode is connected with the base of the vertical bipolar transistor 212. A resistor 313 is connected with the anode of the diode 311 and a ground terminal 8. A resistor 314 is connected between the anode of the diode 312 and the input terminal 6. The vertical bipolar transistors 211, 212 are both NPN type. Regarding the vertical bipolar transistor 211, the collector is connected with the input terminal 6 and the emitter is connected with the ground terminal 8. Regarding the vertical bipolar transistor 212, the collector is connected with electric power terminal 7 and the emitter is connected with the input terminal 6. The resistors 313, 314 are made of a singly crystal silicon, a polysilicon, a metal or the like formed in the same semiconductor integrated circuit chip.

Since today it has swiftly been promote to make the gate insulation film of a CMOS transistor thinner, it is required for the ESD protection apparatus 210 works at a lower voltage than a voltage at which the gate insulation film of the CMOS transistor 100 is broken. In this embodiment, the base potential of the vertical bipolar transistors 211, 212 is increased by voltage decreased at the time when the trigger current, which is the breakdown current of the diodes 311, 312, flows in the resistors 313, 314 to turn on vertical bipolar transistors 211, 212. Consequently, the large quantity of the electric charge attributed to the static electricity accumulated in the input terminal 6 flows to the vertical direction of the silicon substrate. As a result, electric current concentration can be prevented and a high ESD withstand level can be obtained.

To form the trigger element 310 comprising the ESD protection element 210 comprising vertical bipolar transistors 211, 212 and the diodes 311, 312 can be carried out by adding only one ion implantation mask in the common fabrication process of a CMOSFET. Hereinafter, the fabrication method will be described with the reference to FIG. 2 and FIG. 3.

At first, the ESD protection element 210 will be described. Simultaneously with the $N^+$ type diffusion layer 1 of the CMOS transistor 100, the collector lead parts 10 and the emitters 11 are formed and simultaneously with the $P^+$ type diffusion layer 2 of the CMOS transistor 100, the base lead parts 12 are formed. The dummy gate electrodes 13 formed simultaneously with the gate electrodes 3 of the CMOS transistor 100 are employed in order to separate the silicide of the emitters 11 and the base lead parts 12. The dummy gate electrodes 13 are not for applying potential but separate the silicide. Opening parts 50 are formed in a resist using an additional mask for ion implantation and ion implantation is carried out to simultaneously form the $P^-$ region bases 16 and the collector N wells 17. The collector N wells 17 formed at that time and the collector lead parts 10 formed separately are connected with each other by the N wells 14 for connection simultaneously formed with the N well 5 of the CMOS transistor 100. Consequently, vertical bipolar transistors can be fabricated utilizing the CMOS process. Incidentally, the ion implantation may be carried out either before or after of the formation of the gate electrodes 3.

The trigger element 310 will be described next. The $N^+P^-$ type diode has the same structure as the emitters 11 and bases 16 of the ESD protection element 210 and simultaneously with the $N^+$ type diffusion layer 1 of the CMOS transistor 100, the $N^+$ part 21 is formed and simultaneously with the $P^-$ type diffusion layer 2 of the CMOS transistor 100, the lead parts 22 of the $P^-$ parts 26 are formed. Consequently, it is enabled to set a desired trigger voltage and the leakage level in the opposed direction.

Figure 4:
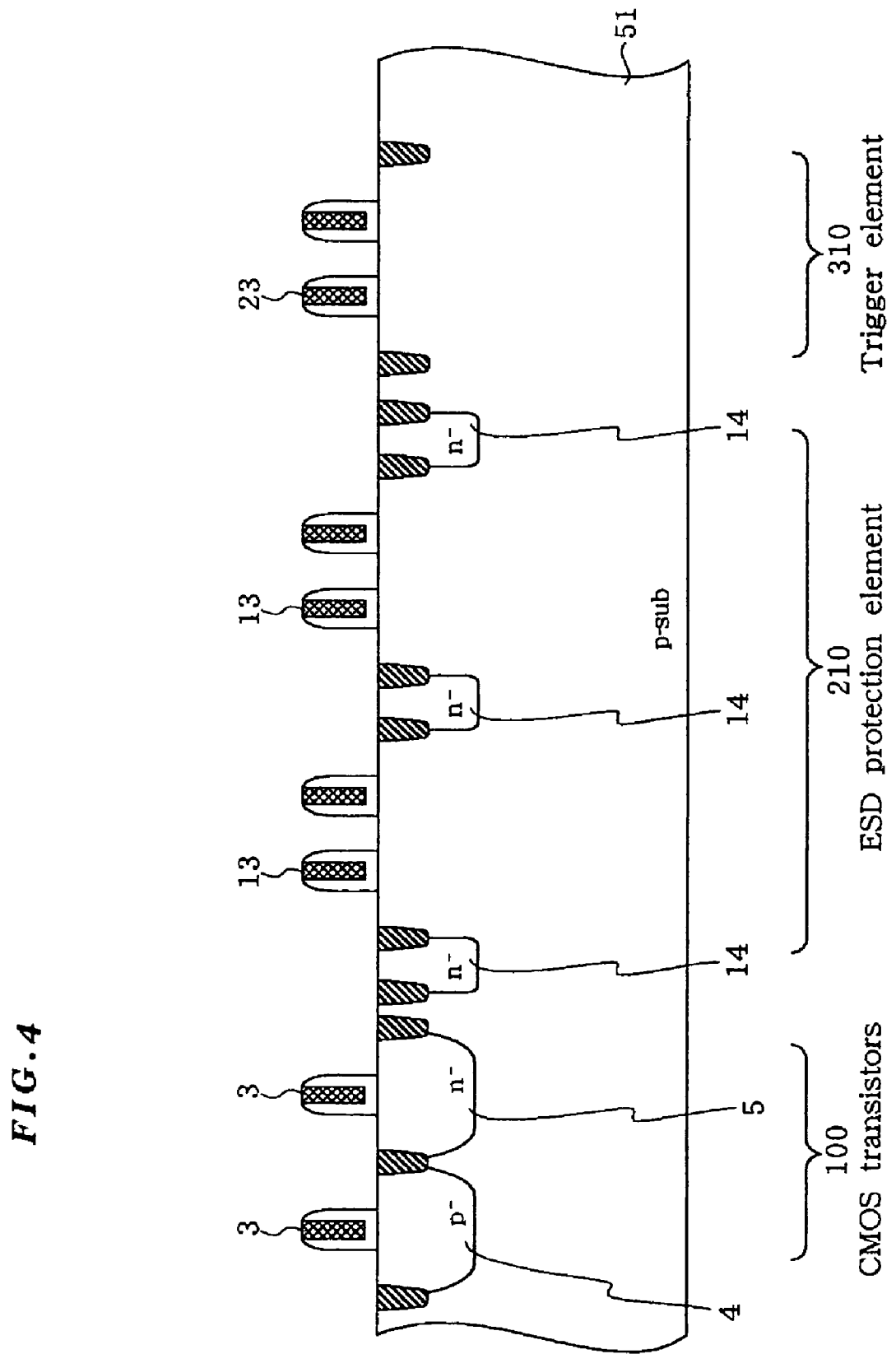
FIG. 4 is a cross-section figure showing the method for fabricating the ESD protection apparatus of FIG. 2 and FIG. 3.
Figure 5:
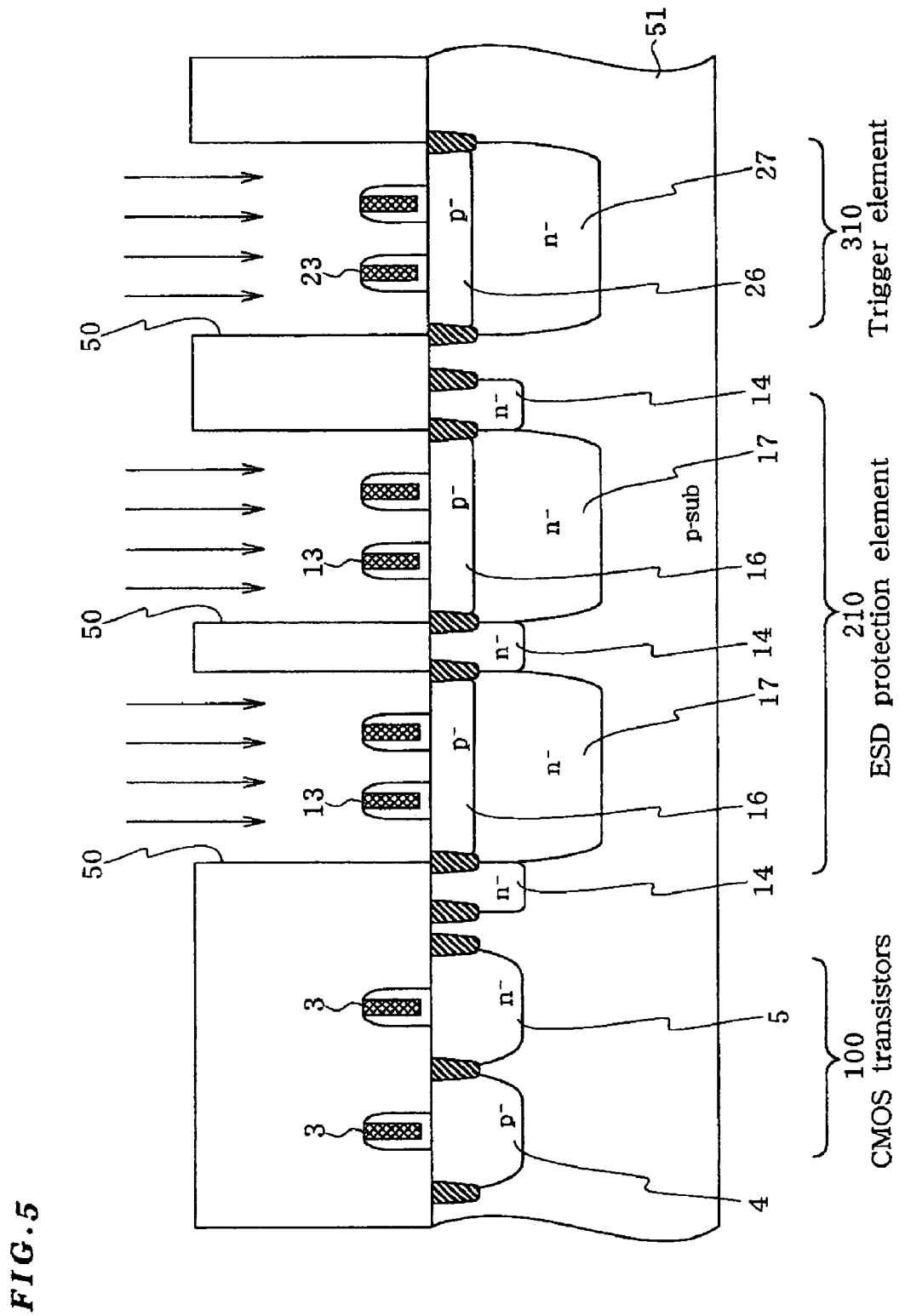
FIG. 5 is a cross-section figure showing the method for fabricating the ESD protection apparatus of FIG. 2 and FIG. 3.
Figure 6:
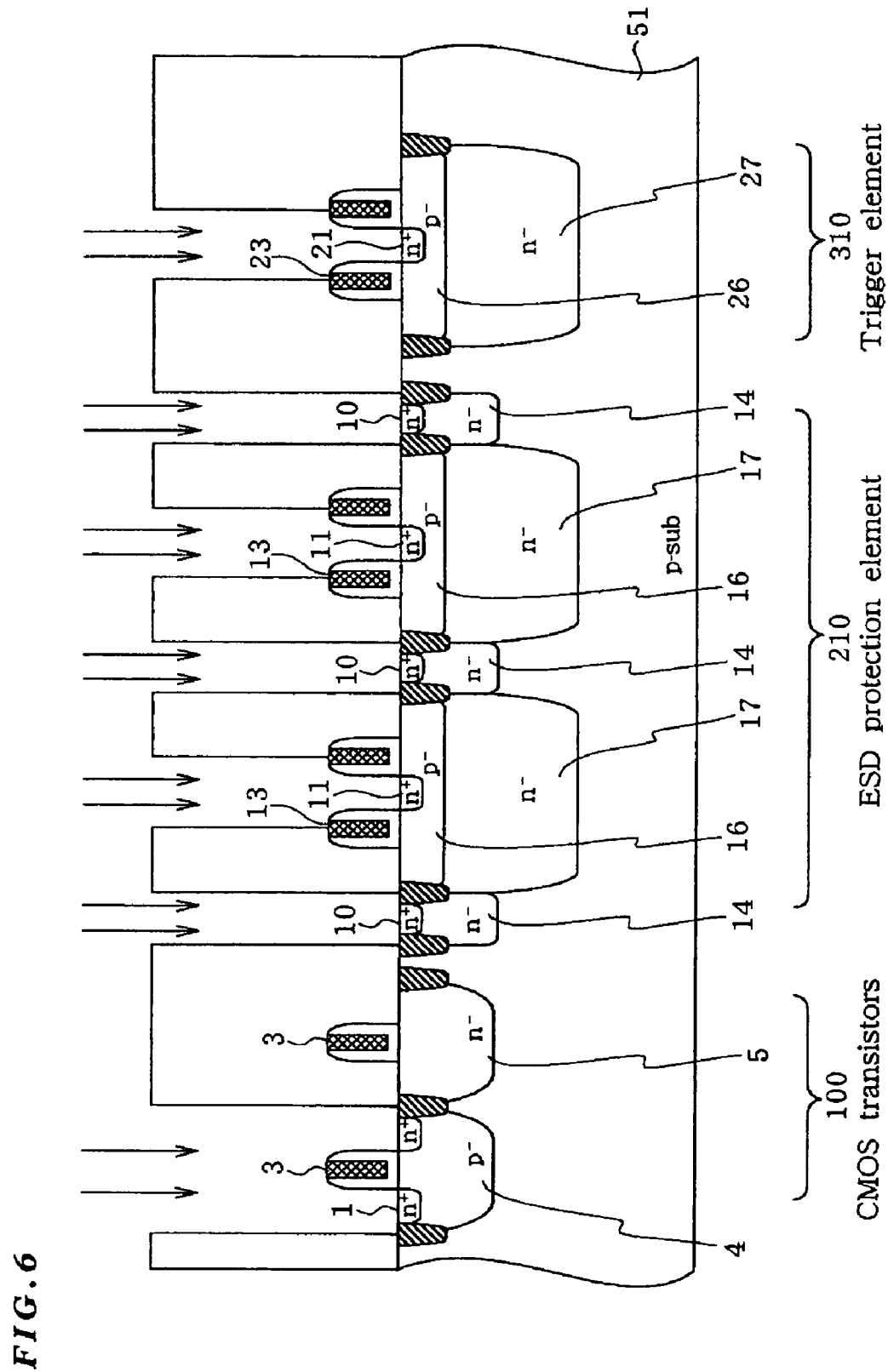
FIG. 6 is a cross-section figure showing the method for fabricating the ESD protection apparatus of FIG. 2 and FIG. 3.

FIG. 4 to FIG. 6 are cross-section illustrations illustrating the method for fabricating the ESD protection apparatus of this embodiment. Hereinafter, the method for fabricating the ESD protection apparatus of the present invention will be described in details.

At first, as illustrated in FIG. 4, simultaneously with formation of N well 5 of CMOS transistor 100, collector lead parts 10 and N wells 14 for connection of the ESD protection element 210 are formed. The doping concentration of these regions is about $10^{17}/cm^{-3}$ to $10^{18}/cm^{-3}$. Also, simultaneously with formation of the gate electrodes 3 of the CMOS transistor 100, the dummy gate electrodes 13 of the ESD protection element 210 and a dummy gate electrode 23 of the trigger element 310 are formed. That is for preventing the emitters 11 and the base lead parts 12 of the ESD protection element 210 from being connected with the silicide formed later on the diffusion layer. In the same manner, that is for preventing the $N^+$ part 21 and the lead parts 22 of trigger element 310 from being connected with the silicide later.

Successively, using opening parts 50 of a resist with a prescribed shape as a mask as illustrated in FIG. 5, ion implantation in about $10^{18}/cm^{-3}$ dose is carried out to form the bases 16 of the ESD protection element 210 and continuously ion implantation in about $10^{18}/cm^{-3}$ dose is carried out to form the collector N wells 17. At that time, the $P^-$ part 26 and the N well 27 of the trigger element 310 are simultaneously formed.

Successively, as illustrated in FIG. 6, simultaneously with formation of the $N^+$ type diffusion layer 1 of the CMOS transistors 100, the collector lead parts 10, emitters 11, $N^+$ parts 21, and the like are formed.

Successively, as illustrated in FIG. 3, simultaneously with the $P^-$ type diffusion layer 2 of the CMOS transistors 100, the base lead parts 12 and lead parts 22 are formed. Finally, wirings are formed on these upper layers to form a circuit as illustrated in FIG. 1.

Next, the operation of the ESD protection apparatus of this embodiment will be described with the reference to FIG. 1 and FIG. 3.

The following description is of the operation at the time when the electrostatic pulses are applied to the input terminal 6. At first, when pulses of positive ESD relative to the ground terminal 8 are applied to the input terminal 6, high voltage is applied to the ESD protection element 210, trigger element 310, and the gate insulation film of the CMOS transistors 100. Therefore, it is required to flow the electric charge by ESD by operation of the ESD protection element 210 before the gate insulation film of the CMOS transistors 100 is broken down.

If the gate insulation film of the CMOS transistors 100 is 4 nm, the gate insulation film is broken by stress of constant voltage of about 8V. That is, it is required for the ESD protection element 210 to operate at a voltage lower than that. However, in the case where the ESD protection element 210, which comprises vertical bipolar transistors, is formed, since the withstand voltage between the collector N wells 17 and the $P^-$ region bases 16 are about as high as 10V, it is insufficient to protect the CMOS transistors 100 whose gate insulation film is thin and fine only by the ESD protection element 210.

Hence, it is required to form the trigger element 310 which operates at a voltage as low as possible and not lower than the electric power source voltage. Since the P part 26 of the trigger element 310 is formed by ion implantation, a desired trigger voltage or leakage level in the opposed direction can be set by controlling the dose quantity and it is easy to obtain trigger voltage of about 4V.

Figure 7:
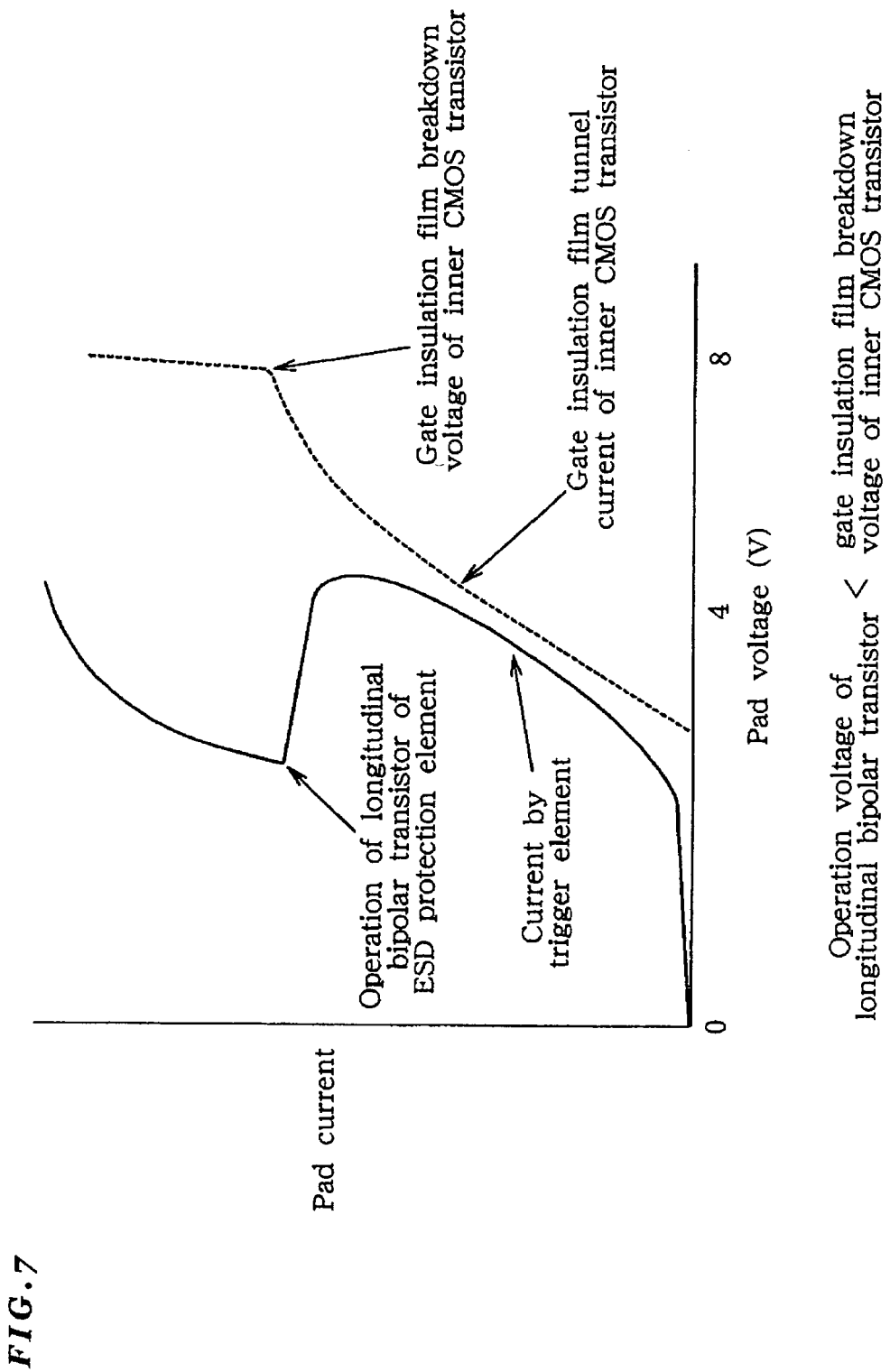
FIG. 7 is a graph showing the voltage-ampere characteristic in case of applying electrostatic pulses of ESD to the pad in the ESD protection apparatus of FIG. 1.

FIG. 7 shows the voltage-ampere characteristic in case of electrostatic pulses application to the pad. At first, when the trigger element 310 works at about 4V, the resultant trigger current and the resistor 313 increase the base potential of the ESD protection element 210 to start the ESD protection element 210. When the ESD protection element 210 starts working, the electric charge applied to the input terminal 6 by the ESD can be flowed to the ground terminal 8 through the vertical bipolar transistor 211. Consequently, if the withstand voltage of the gate insulation film of the inner circuits of the CMOS transistors 100 is 8V, the electric charge can be flowed at a lower voltage than that, so that the breakdown of the gate insulation film can be prevented.

Further, when pulses of negative ESD are applied to the input terminal 6 in relation to the ground terminal 8, since the collector N wells 17 and the P substrate 51 of the ESD protection element 210 shown in FIG. 3 are in $N^+/P^-$ normal direction, electric charge can smoothly be flowed.

Figure 8:
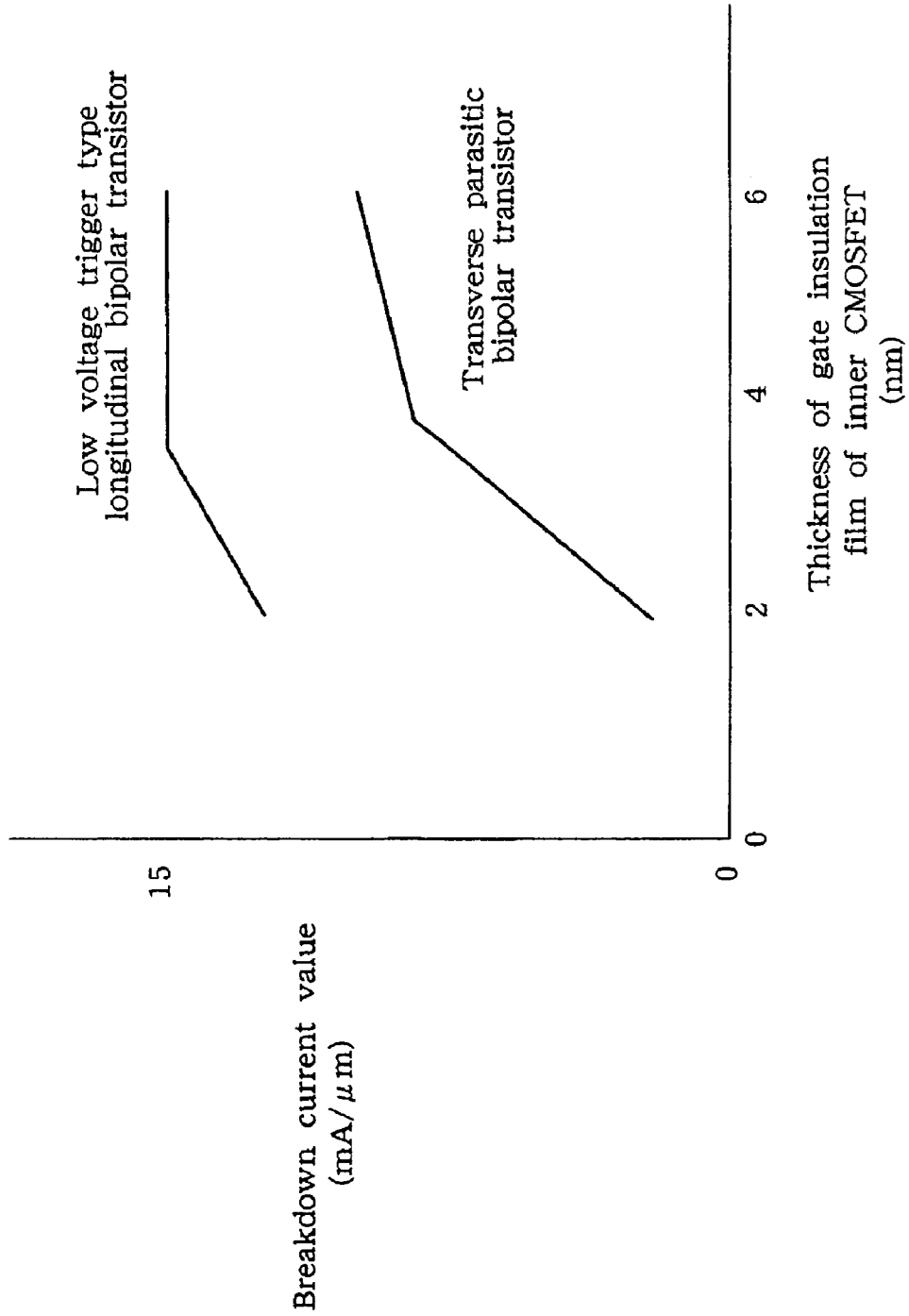
FIG. 8 is a graph showing the breakdown current values per unit length in case of using the ESD protection apparatus of FIG. 1 and in case of using a transverse parasitic bipolar transistor, a conventional MOS transistor.

FIG. 8 shows the breakdown electric current values per unit length in case of using the ESD protection apparatus of the present invention and in case of using a transverse parasitic bipolar transistor, which is a conventional MOS transistor. The breakdown electric current of the ESD protection element of this embodiment comprising vertical bipolar transistors is higher than that of an ESD protection element comprising transverse bipolar transistors. Also, if the inner gate insulation film is as thin as about 2 nm, the breakdown electric current is sharply lowered in case of the transverse bipolar transistors, the decrease is slight in case of the vertical bipolar transistors.

Figure 9:
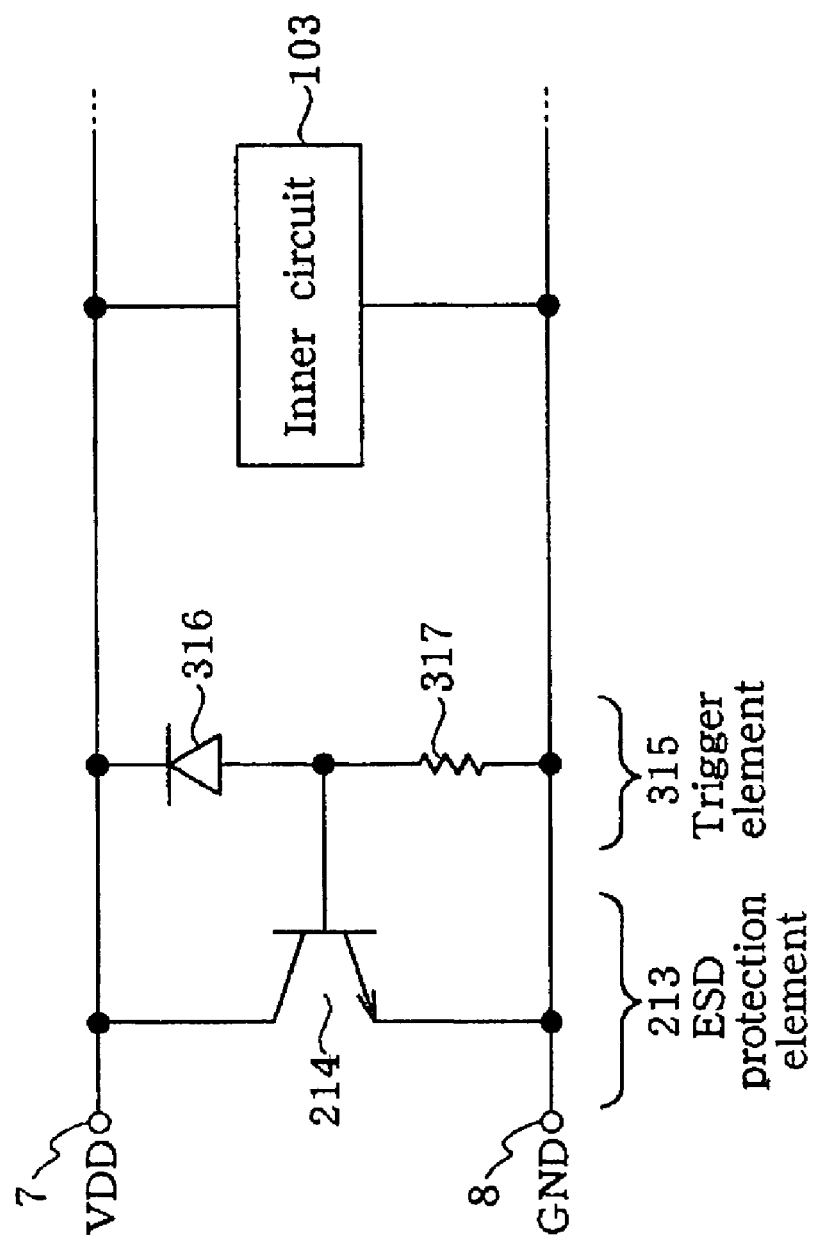
FIG. 9 is a circuit diagram illustrating a second embodiment of an ESD protection apparatus of the present invention.

FIG. 9 is a circuit diagram showing a second embodiment of an ESD protection apparatus relevant to the present invention. Hereinafter, description will be given with reference to the figure. The ESD protection apparatus of this embodiment works as an electric power source protection circuit.

The ESD protection apparatus of this embodiment is installed between an electric power terminal (an electric power pad) 7 of a semiconductor integrated circuit chip and an inner circuit 103 and comprises a trigger element 315 comprising a diode 316 to be broken down by overvoltage applied to the electric power terminal 7 and an ESD protection element 213 comprising a vertical bipolar transistor 214 for discharging the accumulated electric charge of the electric power terminal 7 by being electrically communicated owing to the breakdown of the diode 316.

Regarding the diode 316, the cathode is connected with the electric power terminal 7 and the anode is connected with the base of the vertical bipolar transistor 214. A resistor 317 is connected between the anode of the diode 316 and a ground terminal 8. Regarding the vertical bipolar transistor 214, it is NPN type, and the collector is connected with the electric power terminal 7 and the emitter is connected with the ground terminal 8.

The plan view and the cross-section figure are same as FIG. 2 and FIG. 3 except the reference numerals. Consequently, the ESD protection apparatus of this embodiment also performs the same functions and effects.

Figure 10:
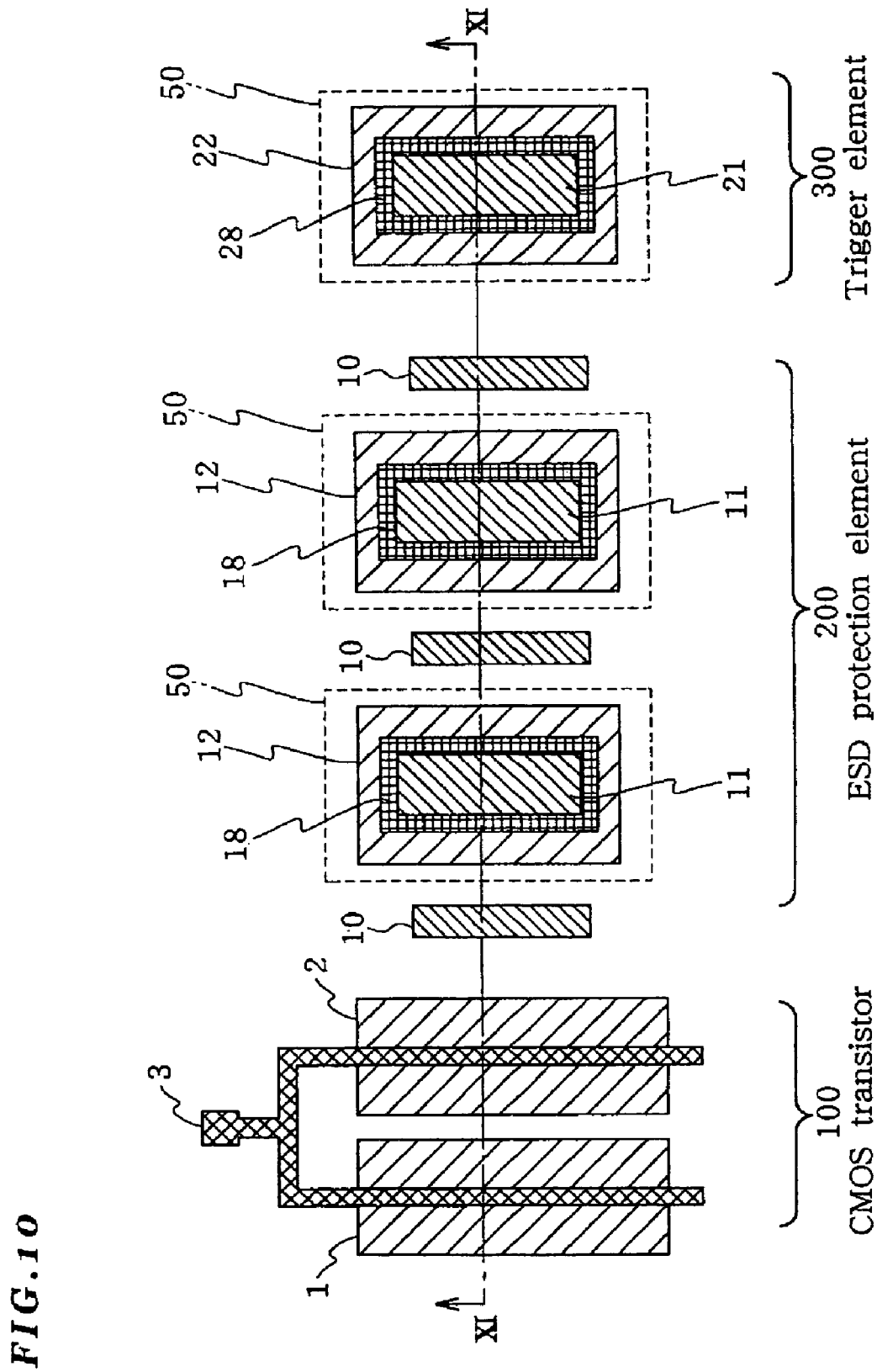
FIG. 10 is a plan view illustrating a third embodiment of an ESD protection apparatus of the present invention.
Figure 11:
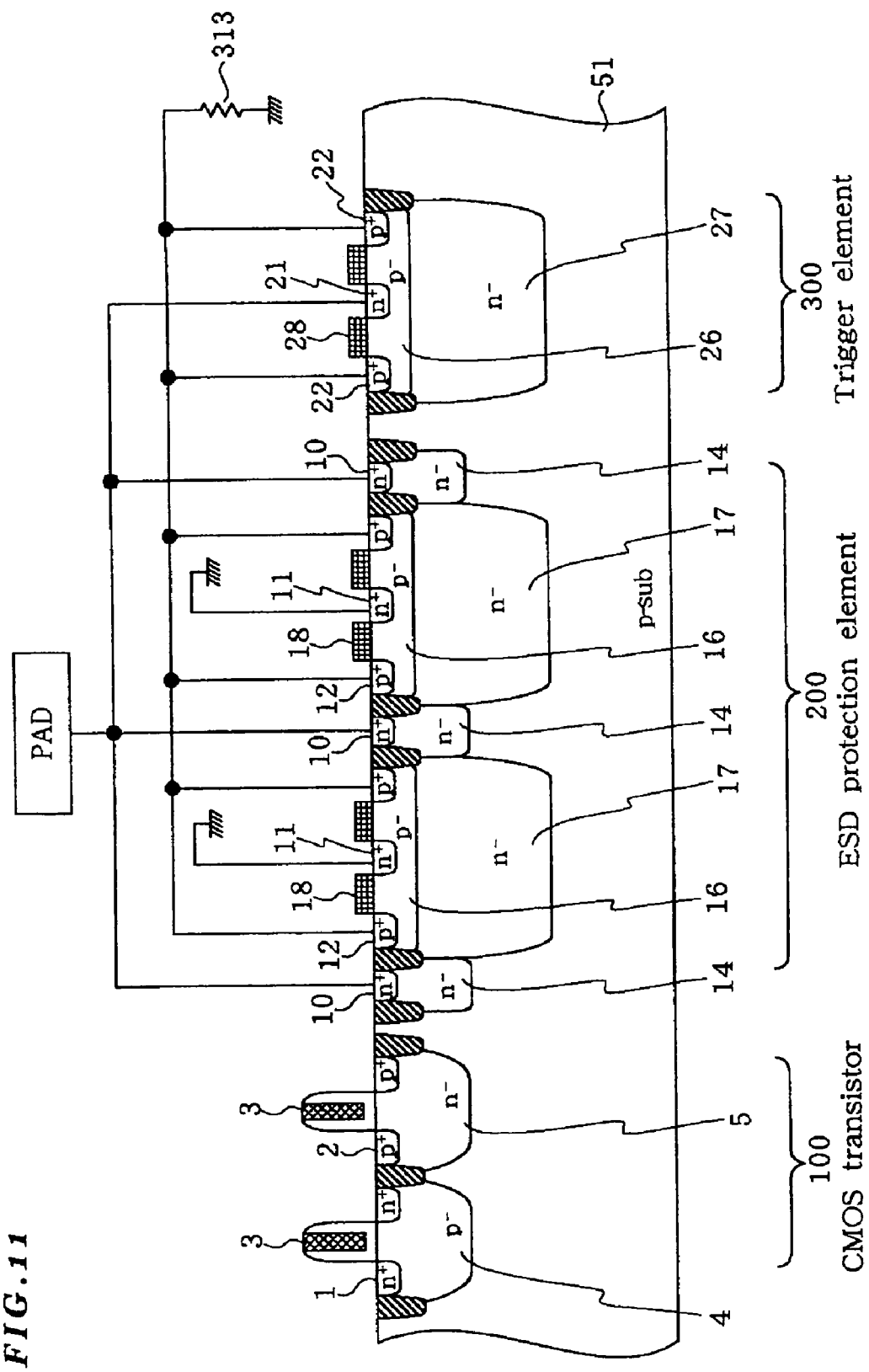
FIG. 11 is a vertical cross-section figure cut along the XI-XI line in FIG. 10.

FIG. 10 to FIG. 15 illustrate a third embodiment of an ESD protection apparatus relevant to the present invention. FIG. 10 shows a plan view, FIG. 11 shows the vertical cross-section figure cut along the XI-XI line in FIG. 10, and FIG. 12 to FIG. 15 show the cross-section figures illustrating the fabrication method. Hereinafter, description will be given with reference to these figures. Incidentally, the same reference numerals are assigned to these same as the parts in FIG. 2 and FIG. 6 and their description is omitted.

The ESD protection apparatus of this embodiment is an example in which insulation films 18, 28 ($SiO_2$ or SiN) covering the diffusion layer as to prevent silicide formation are used for resistor element formation in place of the dummy gate electrodes 13, 23 for silicide separation (in FIG. 2 and FIG. 3).

Figure 12:
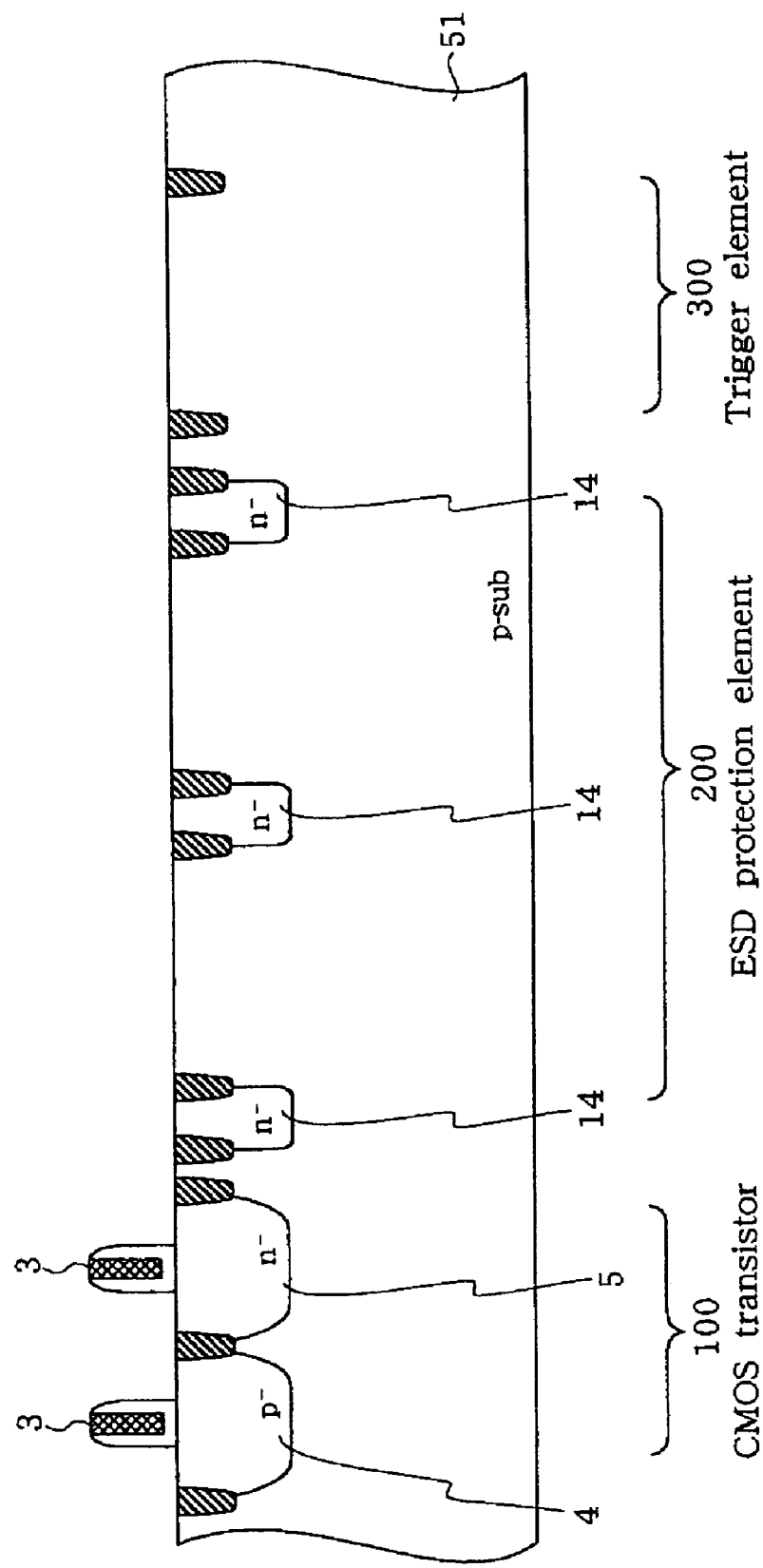
FIG. 12 is a cross-section figure showing the method for fabricating the ESD protection apparatus of FIG. 10 and FIG. 11.

At first, as illustrated in FIG. 12, simultaneously with formation of the N well 5 of the CMOS transistors 100, the N well 14 for connection with the collector lead parts 10 of the ESD protection element 200 is formed.

Figure 13:
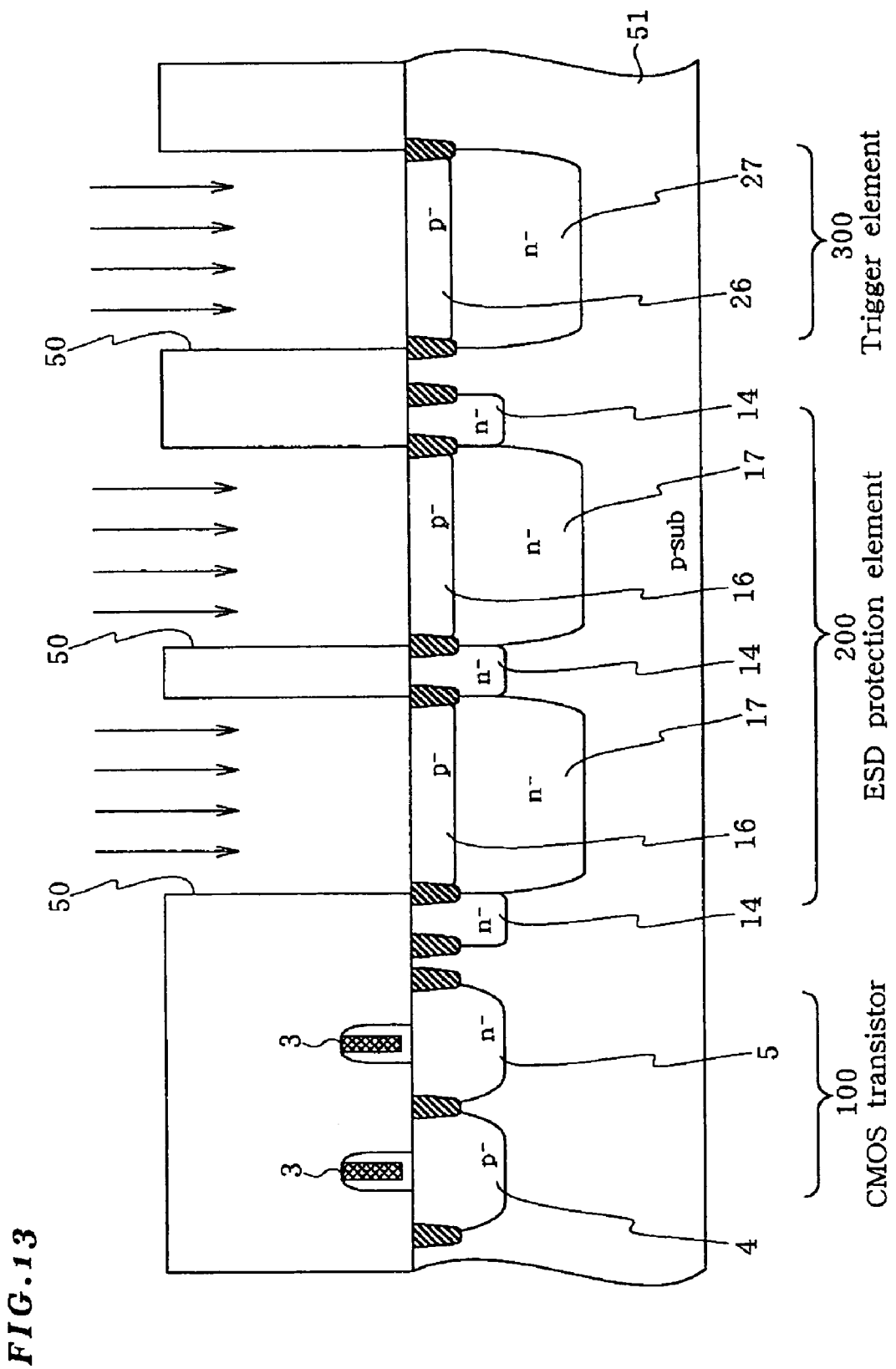
FIG. 13 is a cross-section figure showing the method for fabricating the ESD protection apparatus of FIG. 10 and FIG. 11.

Successively, as illustrated in FIG. 13, using opening parts 50 of a resist with a prescribed shape as a mask, ion implantation is carried out to form the bases 16 of the ESD protection element 200 and continuously ion implantation is carried out to form the collector N wells 17. At that time, the $P^-$ part 26 and the N well 27 of the trigger element 300 are simultaneously formed.

Figure 14:
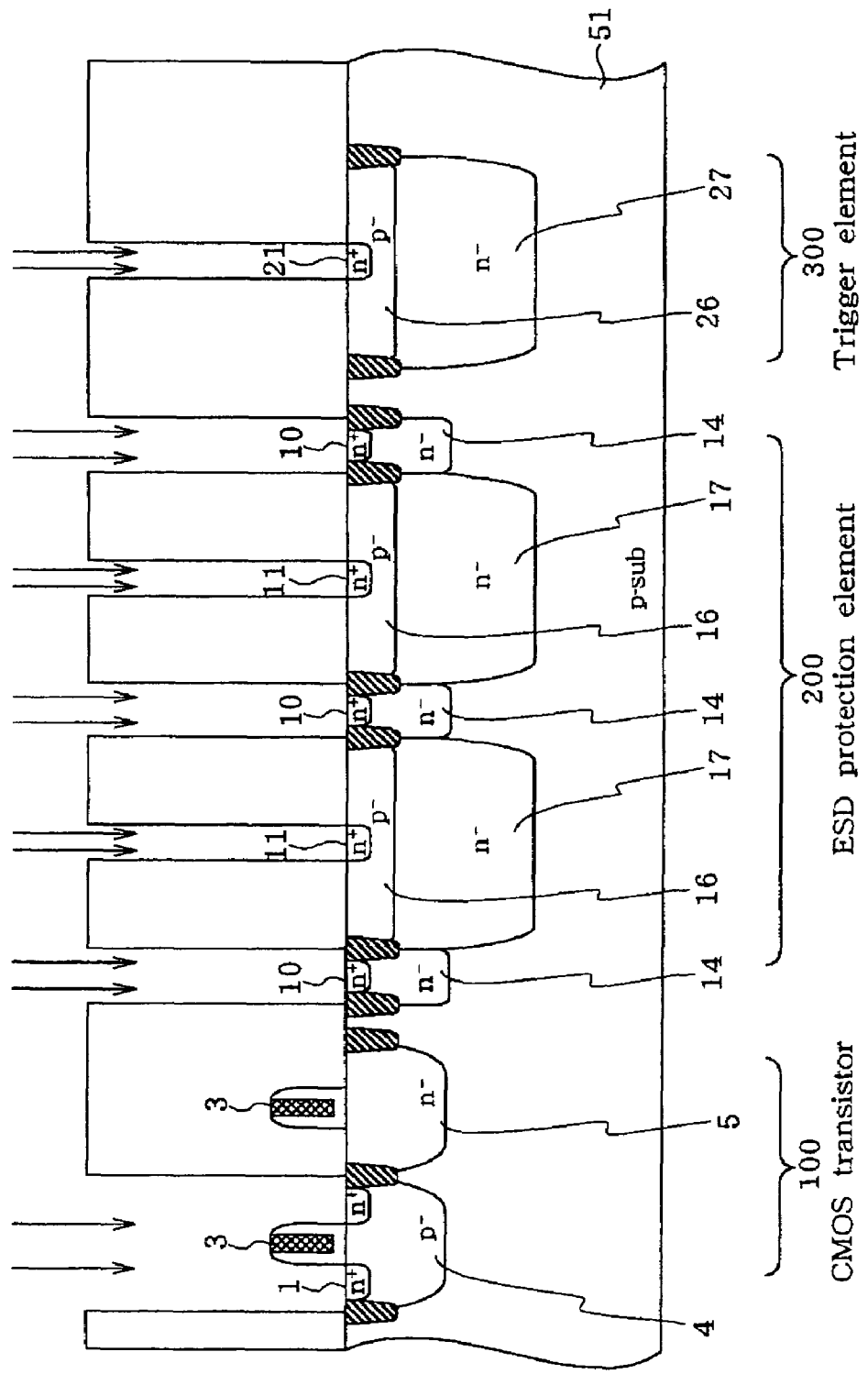
FIG. 14 is a cross-section figure showing the method for fabricating the ESD protection apparatus of FIG. 10 and FIG. 11.

Successively, as illustrated in FIG. 14, simultaneously with formation of the $N^+$ type diffusion layer 1 of the CMOS transistors 100, the collector lead parts 10, emitters 11, $N^+$ parts 21, and the like are formed.

Figure 15:
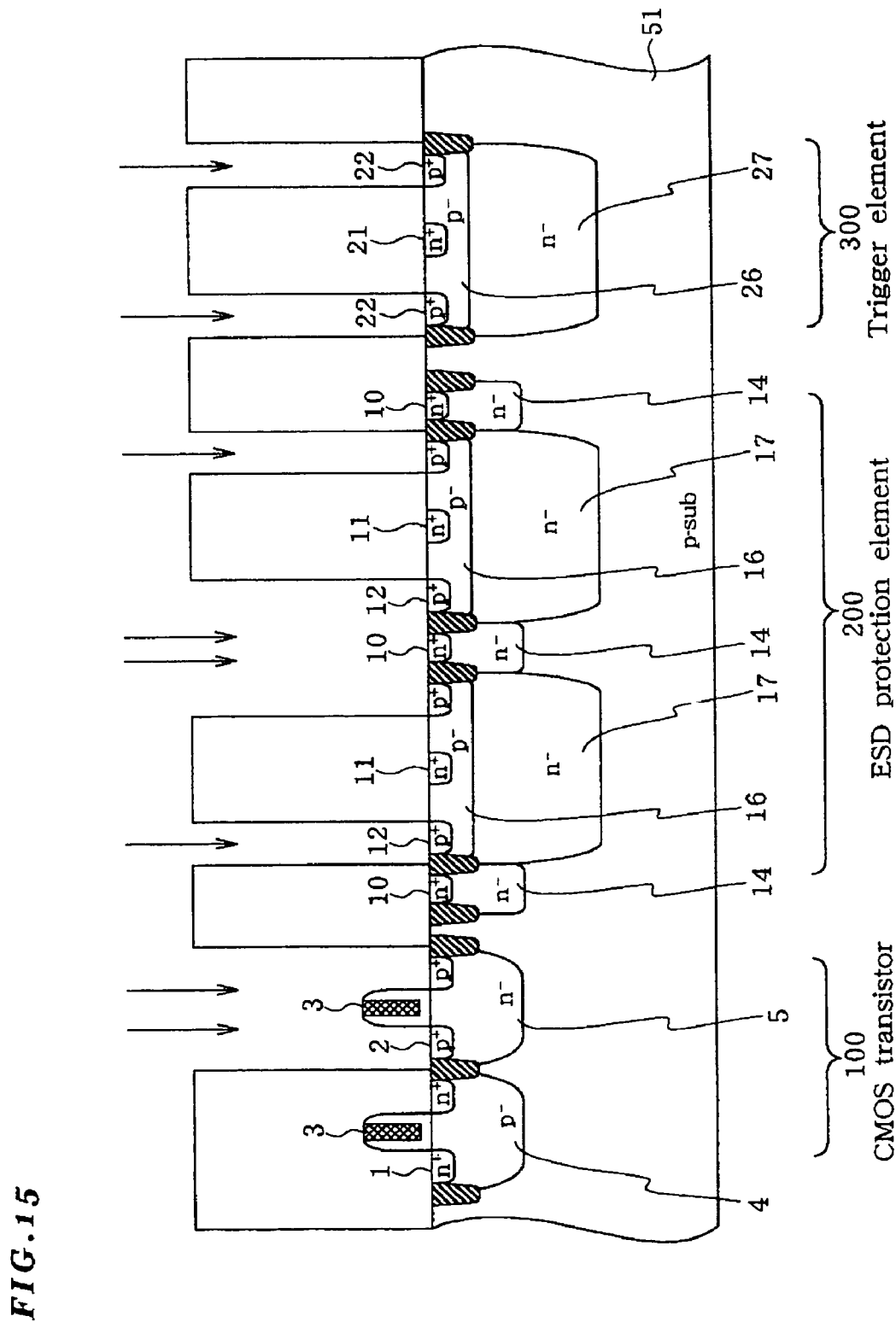
FIG. 15 is a cross-section figure showing the method for fabricating the ESD protection apparatus of FIG. 10 and FIG. 11.

Successively, as illustrated in FIG. 15, simultaneously with the $P^+$ type diffusion layer 2 of the CMOS transistors 100, the base lead parts 12, lead parts 22, and the like are formed.

Successively, as illustrated in FIG. 11, the insulation film 18 in ESD protection element 200 and the insulation film 28 in the trigger element 310 are formed. That is for preventing the connection of the emitters 11 and the base lead parts 12 of ESD protection element 200 with each other by the silicide formed in the diffusion layer thereafter. Simultaneously, that is also for preventing the connection of the $N^+$ part 21 and the lead parts 22 of trigger element 300 with each other by the silicide.

Finally, wirings are formed on these upper layers to form a circuit as illustrated in FIG. 1.

Figure 16:
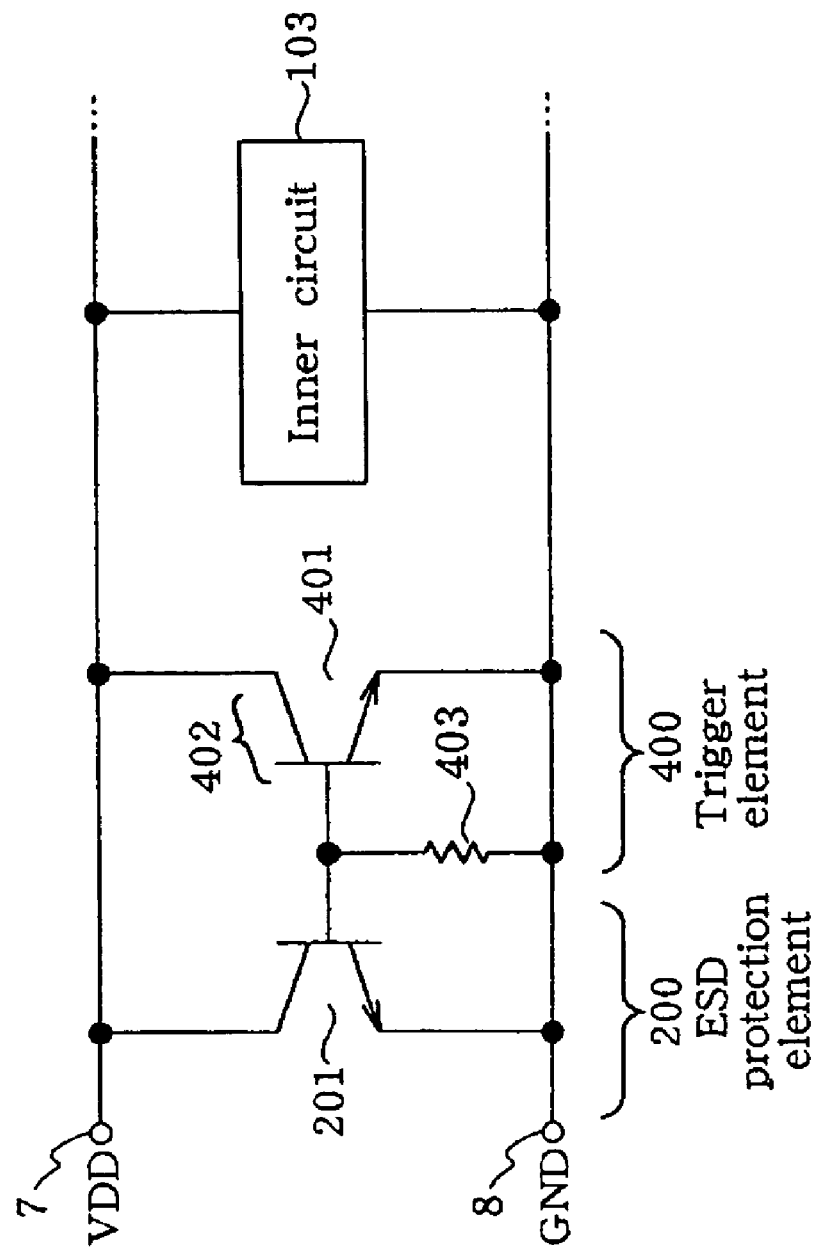
FIG. 16 is a circuit diagram illustrating a fourth embodiment of an ESD protection apparatus of the present invention.
Figure 17:
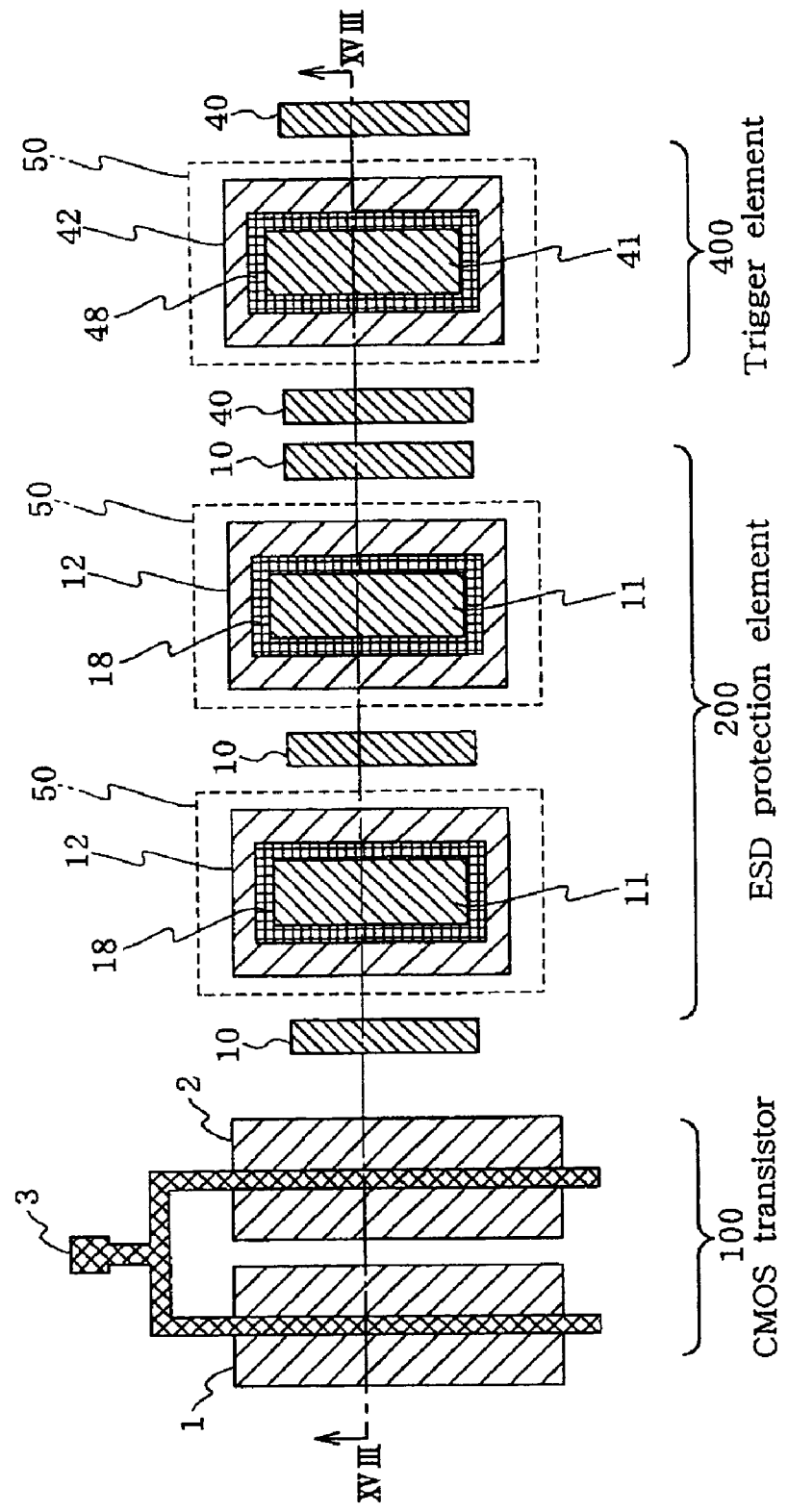
FIG. 17 is a plane view of the ESD protection apparatus in FIG. 16.
Figure 18:
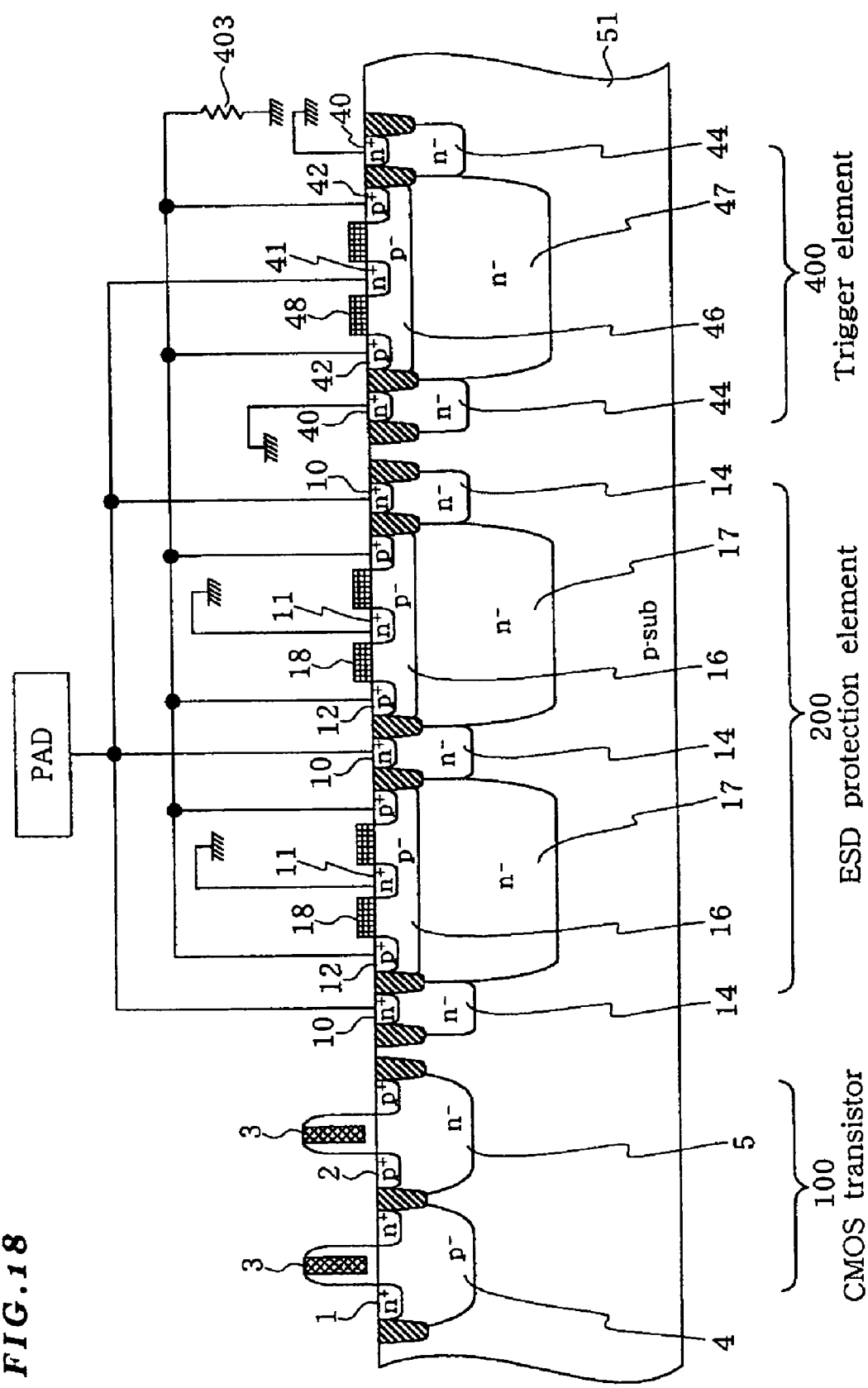
FIG. 18 is a vertical cross-section figure cut along the XVIII-XVIII line in FIG. 17.

FIG. 16 to FIG. 18 illustrate a fourth embodiment of an ESD protection apparatus relevant to the present invention. FIG. 16 shows a circuit diagram, FIG. 17 shows a plan view, and FIG. 18 shows the vertical cross-section figure cut along the XVIII-XVIII line in FIG. 17. Hereinafter, description will be given with reference to these figures. In the ESD protection apparatus of this embodiment, the trigger element is also used as a vertical bipolar transistor of the ESD protection element.

The ESD protection apparatus of this embodiment is installed between an electric power terminal (an electric power pad) 7 of a semiconductor integrated circuit chip and an inner circuit 103 and comprises a trigger element 400 comprising a diode 402 to be broken down by overvoltage applied to the electric power terminal 7 and an ESD protection element 200 comprising a vertical bipolar transistor 201 for discharging the accumulated electric charge of the electric power terminal 7 by being electrically communicated owing to the breakdown of the diode 402.

The diode 402 is between the collector and the base of the vertical bipolar transistor 401. The cathode of the diode 402, which the collector of the vertical bipolar transistor 401, is connected with the electric power terminal 7 and the anode of the diode 402, which is the base of the vertical bipolar transistor 401, is connected with the base of the vertical bipolar transistor 201. A resistor 403 is connected between the anode of the diode 402, which is the base of the vertical bipolar transistor 401, and a ground terminal 8. Regarding the vertical bipolar transistors 201, 401, they are NPN type, and the collector is connected with the electric power terminal 7 and the emitter is connected with the ground terminal 8.

In this embodiment, emitter lead parts 40 are formed in the trigger element 400 and connected as illustrated in FIG. 16 and FIG. 18. By connecting in such a manner, the vertical bipolar transistor 401 is formed in the trigger element 400 and the trigger element 400 can work as an ESD protection element. The base potential of the vertical bipolar transistors 201, 401 is increased by the trigger current of the diode 402 composed of the $N^+$ part (the collector) 41 and the $P^-$ part (the base) 46 of the trigger element 400 and the resistor 403 and owing the cooperation, the electric charge attributed to the static electricity accumulated in the electric power terminal 7 can be released by both of them. Incidentally, although the ESD protection apparatus of this embodiment is employed as the electric power pad, it may be also employed as an input pad or an output pad by installing two as same in the first embodiment.

Figure 19:
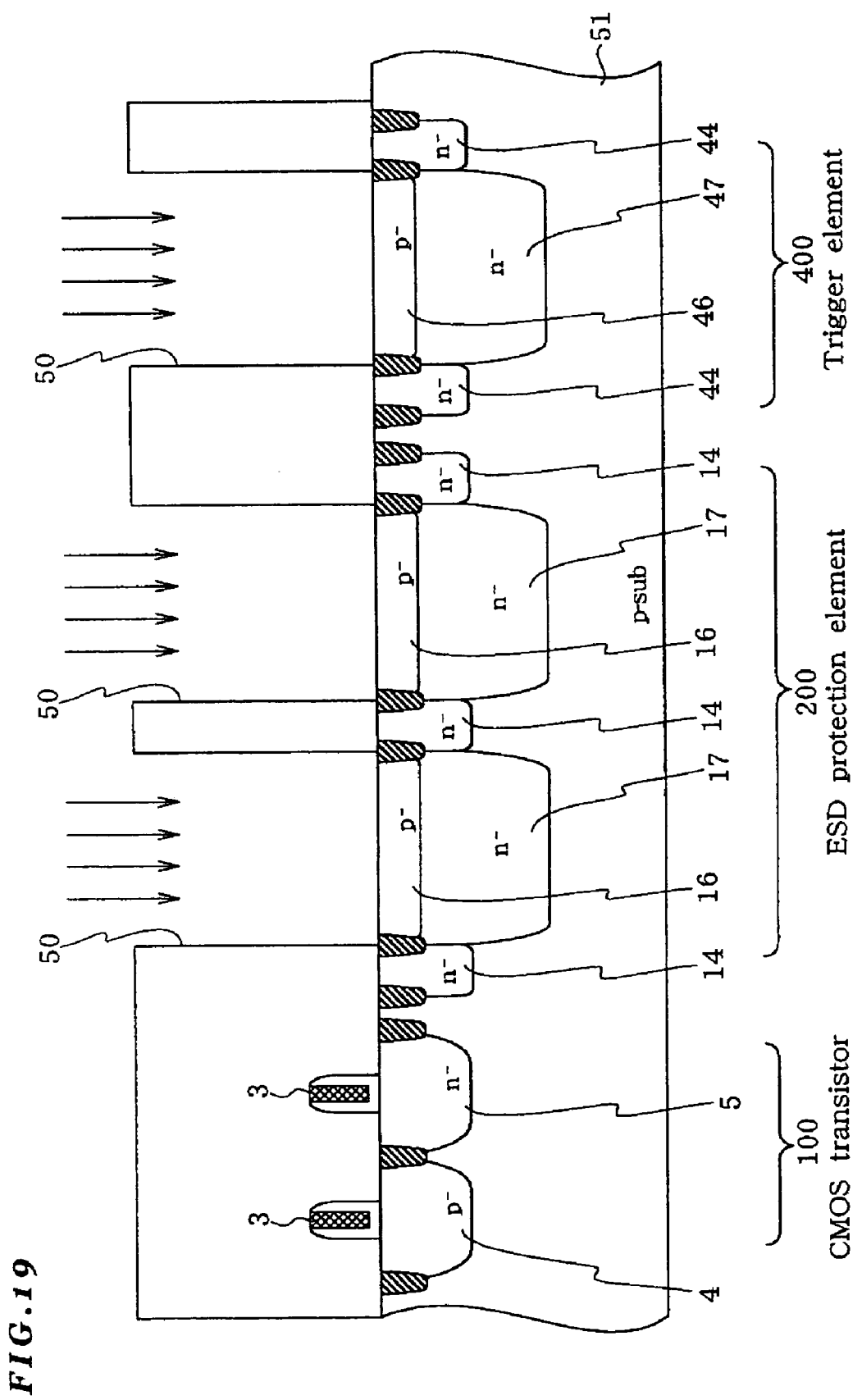
FIG. 19 is a cross-section figure showing the method for fabricating the ESD protection apparatus of FIG. 16.
Figure 20:
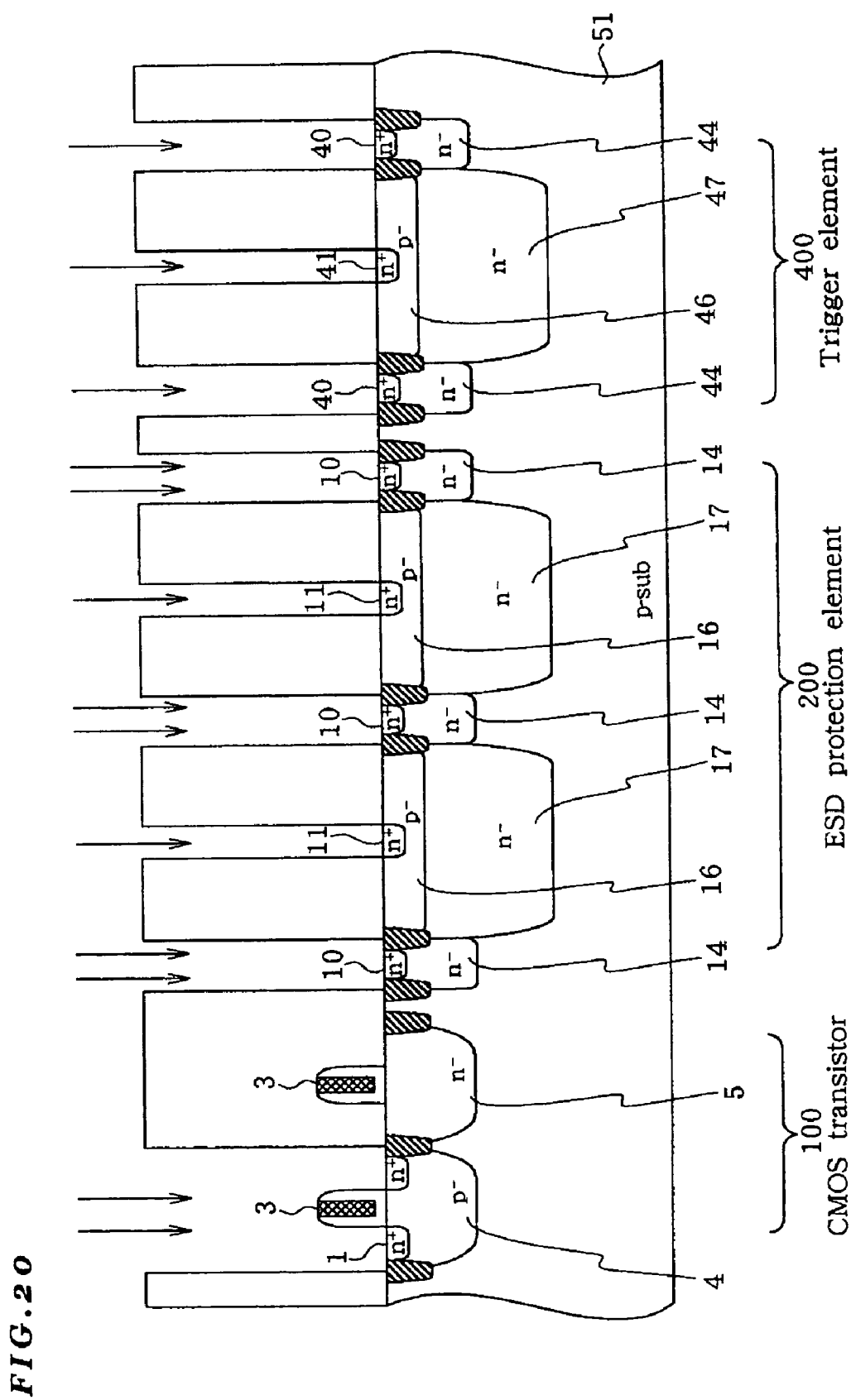
FIG. 20 is a cross-section figure showing the method for fabricating the ESD protection apparatus of FIG. 16.

FIG. 19 and FIG. 20 are cross-section figures illustrating the method for fabricating the ESD protection apparatus of this embodiment. Hereinafter, detailed description of the method for fabricating the ESD protection apparatus of this embodiment will be given with reference to FIG. 18 to FIG. 20.

At first, simultaneously with formation of N well 5 of the CMOS transistors 100, N wells 14 for connection for the collector lead parts 10 of the ESD protection element 200 and N wells 44 for emitter connection of the trigger element 400 are formed.

Successively, as illustrated in FIG. 19, using opening parts 50 of a resist with a prescribed shape as a mask, ion implantation is carried out to form the bases 16 of the ESD protection element 200 and continuously ion implantation is carried out to form the collector N wells 17. At that time, the P⁻ part 46 and the emitter N well 47 of the trigger element 400 are simultaneously formed.

Successively, as illustrated in FIG. 20, simultaneously with formation of the N⁺ type diffusion layer 1 of the CMOS transistors 100, the collector lead parts 10 and emitters 11 of the ESD protection element 200, as well as the emitter lead parts 40 and collector 41 of the trigger element 400 are formed. Further, simultaneously with formation of the P⁺ type diffusion layer 2 of the CMOS transistors 100, the base lead parts 12 and lead parts 42 of the P⁻ parts 46 to be base of the trigger element 400 are formed.

The insulation film 18 of the ESD protection element 200 and the insulation film 48 of the trigger element 400 are formed. That is for preventing the emitters 11 and the base lead parts 12 of the ESD protection element 200 from being connected with the silicide formed later on the diffusion layer. In the same manner, that is for preventing the N⁺ part 41 and the lead parts 42 of trigger element 400 from being connected with the silicide later.

Finally, wirings are formed on these upper layers to form a circuit as illustrated in FIG. 16.

Figure 21:
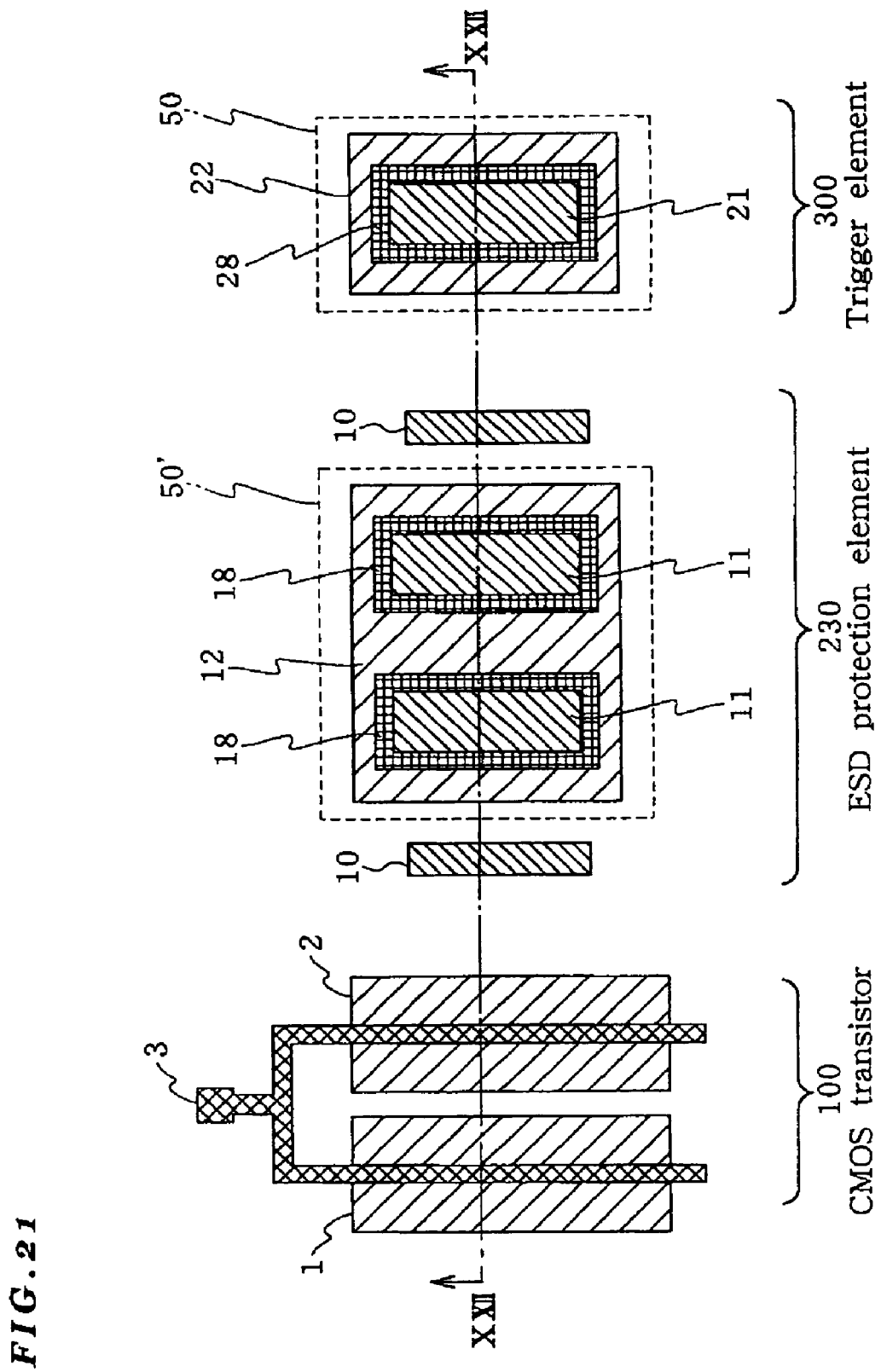
FIG. 21 is a plan view illustrating a fifth embodiment of an ESD protection apparatus of the present invention.
Figure 22:
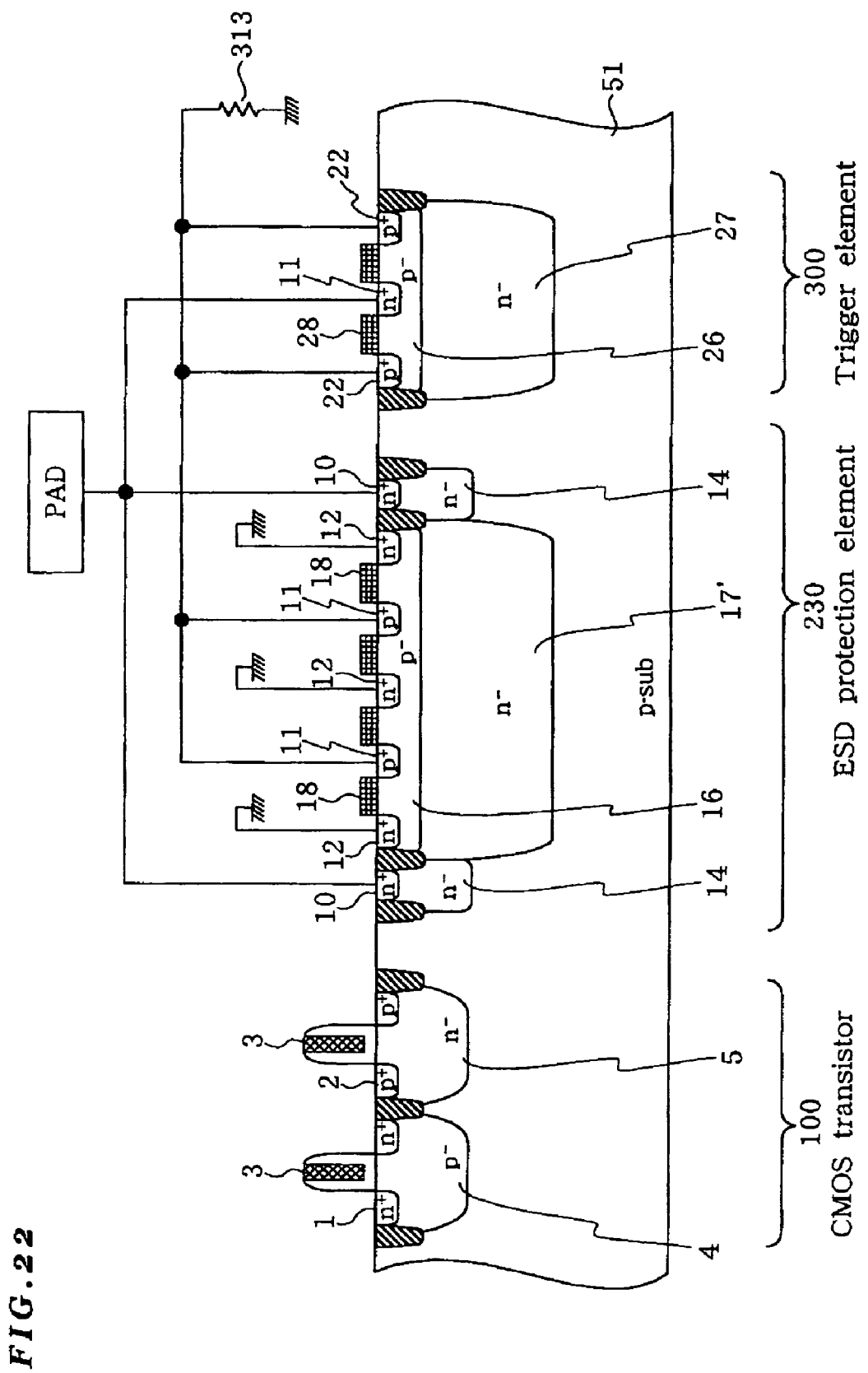
FIG. 22 is a vertical cross-section figure cut along the XXII-XXII line in FIG. 21.

FIG. 21 to FIG. 22 illustrate a fifth embodiment of an ESD protection apparatus relevant to the present invention. FIG. 21 shows a plan view and FIG. 22 shows the vertical cross-section figure cut along the XXII-XXII line in FIG. 21. Hereinafter, description will be given with reference to these figures. In the ESD protection apparatus of this embodiment, the collector of the ESD protection elements is utilized in common in order to miniaturize the surface area.

The ESD protection apparatus 230 of this embodiment comprises one collector N well 17' by making two collector N wells 17 in common in the ESD protection element 200 of the third embodiment illustrated in FIG. 10 and FIG. 11. The surface area is miniaturized by using collector lead parts 10 only in both ends of the collector N well 17'. The method for fabricating the ESD protection apparatus of this embodiment is same as that of the third embodiment illustrated in FIG. 12 to FIG. 15.

Figure 23:
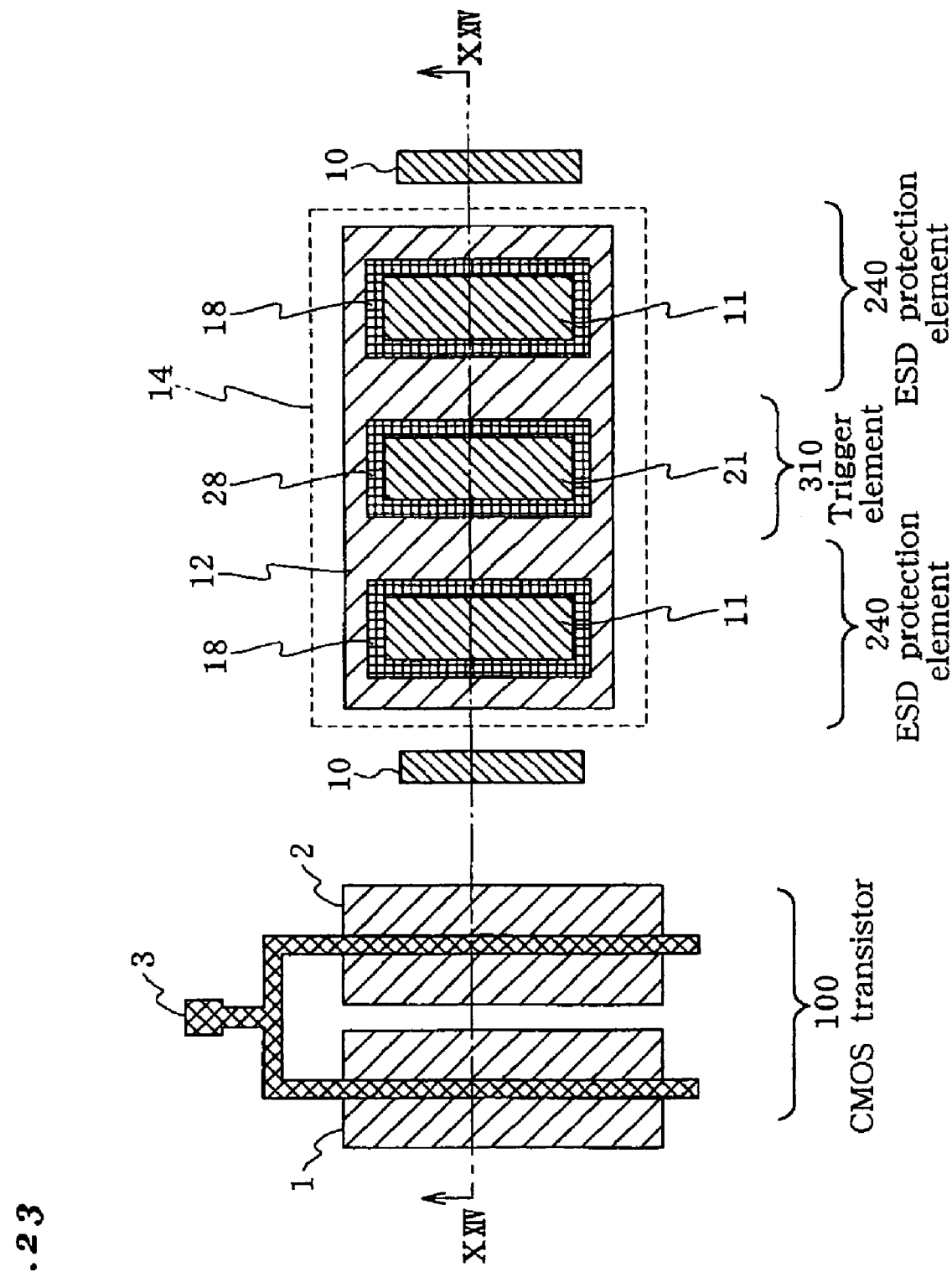
FIG. 23 is a plan view illustrating a sixth embodiment of an ESD protection apparatus of the present invention.
Figure 24:
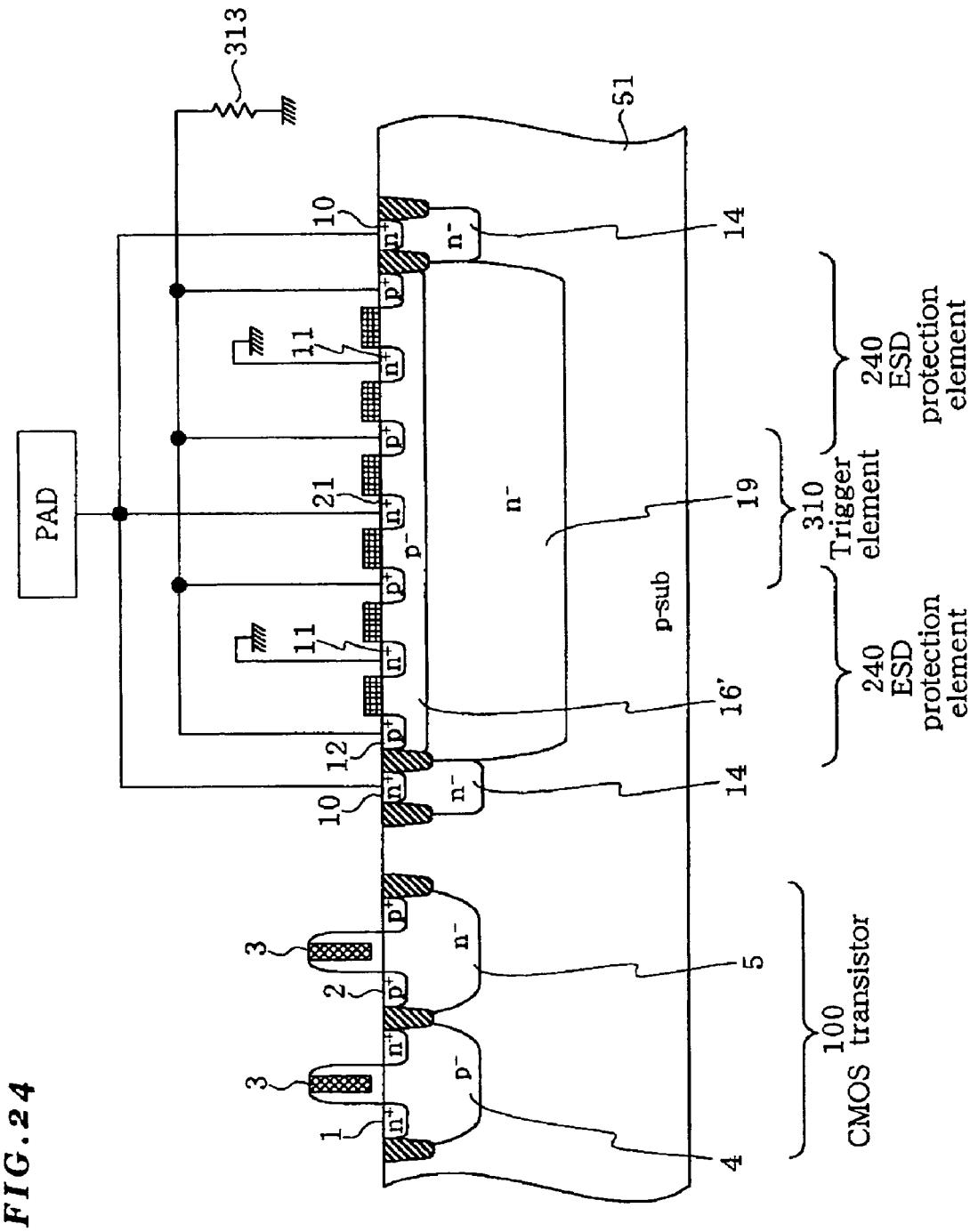
FIG. 24 is a vertical cross-section figure cut along the XXIV-XXIV line in FIG. 23.

FIG. 23 to FIG. 24 illustrate a sixth embodiment of an ESD protection apparatus relevant to the present invention. FIG. 23 shows a plan view and FIG. 24 shows the vertical cross-section figure cut along the XXIV-XXIV line in FIG. 23. Hereinafter, description will be given with reference to these figures. In the ESD protection apparatus of this embodiment, the ESD protection element and the trigger element are made in common in order to miniaturize the surface area.

The ESD protection elements 240 and the trigger element 310 of this embodiment are formed by combining two bases 16 and the P part 26 of the ESD protection element 240 and the trigger element 310 in the third embodiment illustrated in FIG. 10 and FIG. 11 into one base 16' and at the same time combining two collector N wells 17 and the N well 27 of the ESD protection element 240 and the trigger element 310 in the third embodiment into one collector N well 17. The surface area is miniaturized by using collector lead parts 10 of the ESD protection elements 240 only in both ends. The method for fabricating the ESD protection apparatus of this embodiment is same as that of the third embodiment illustrated in FIG. 12 to FIG. 15.

Figure 25:
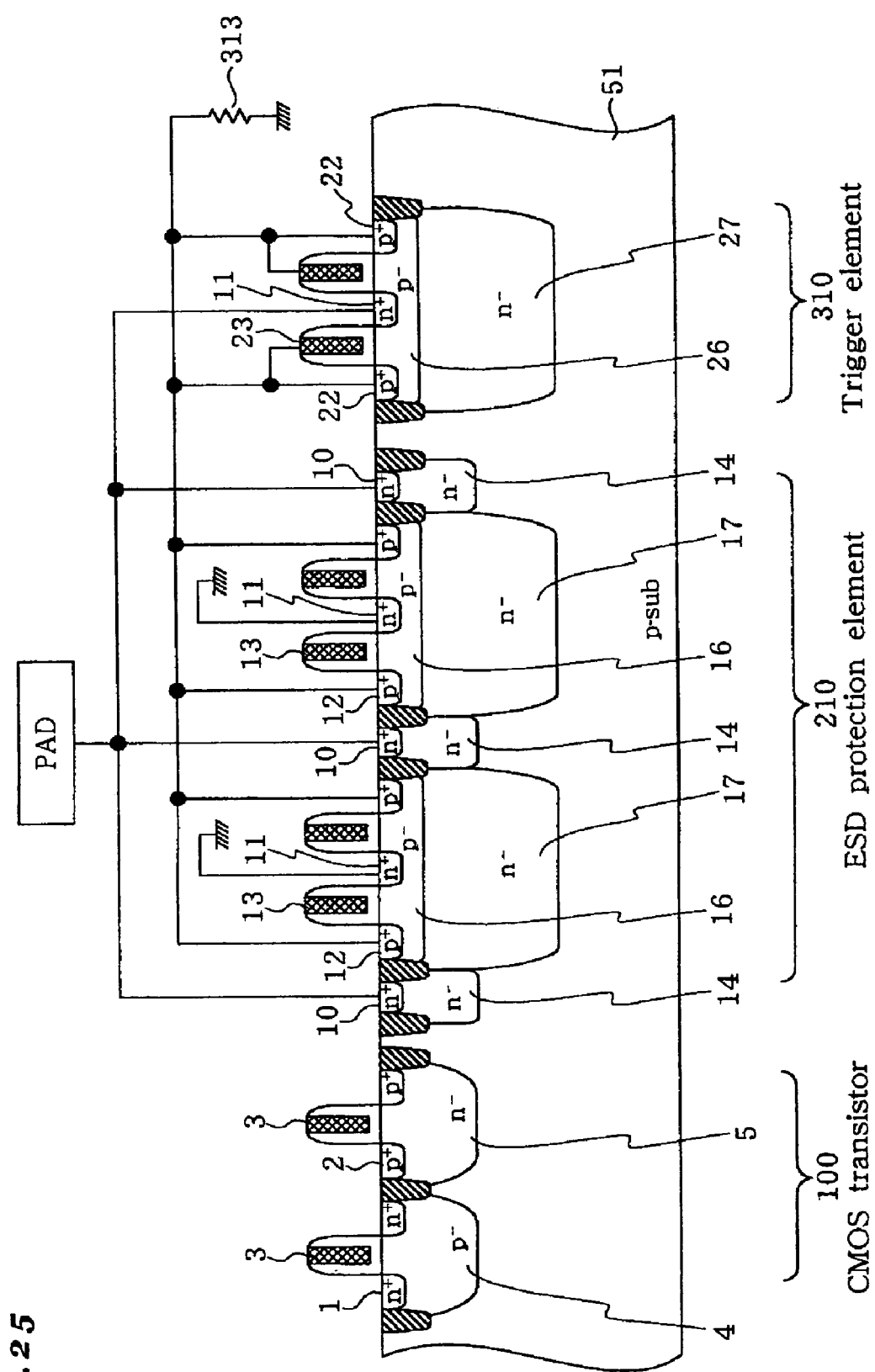
FIG. 25 is a cross-section figure illustrating a seventh embodiment of an ESD protection apparatus of the present invention.

FIG. 25 illustrates the vertical cross-section figure of a seventh embodiment of an ESD protection apparatus relevant to the present invention. Hereinafter, description will be given with reference to the figure. In the ESD protection apparatus of this embodiment, the ESD protection element is made to be a trigger element capable of triggering at lower voltage.

The ESD protection apparatus of this embodiment is same as the first embodiment except that the dummy gate electrode 23 of the trigger element 310 is fixed in the ground. In case of fixing the dummy gate electrodes 23 of the trigger element 310 in the ground, the electric field is intensified between the N⁺ part 21 and the dummy gate electrodes 23, so that triggering is caused at a lower voltage.

Figure 26:
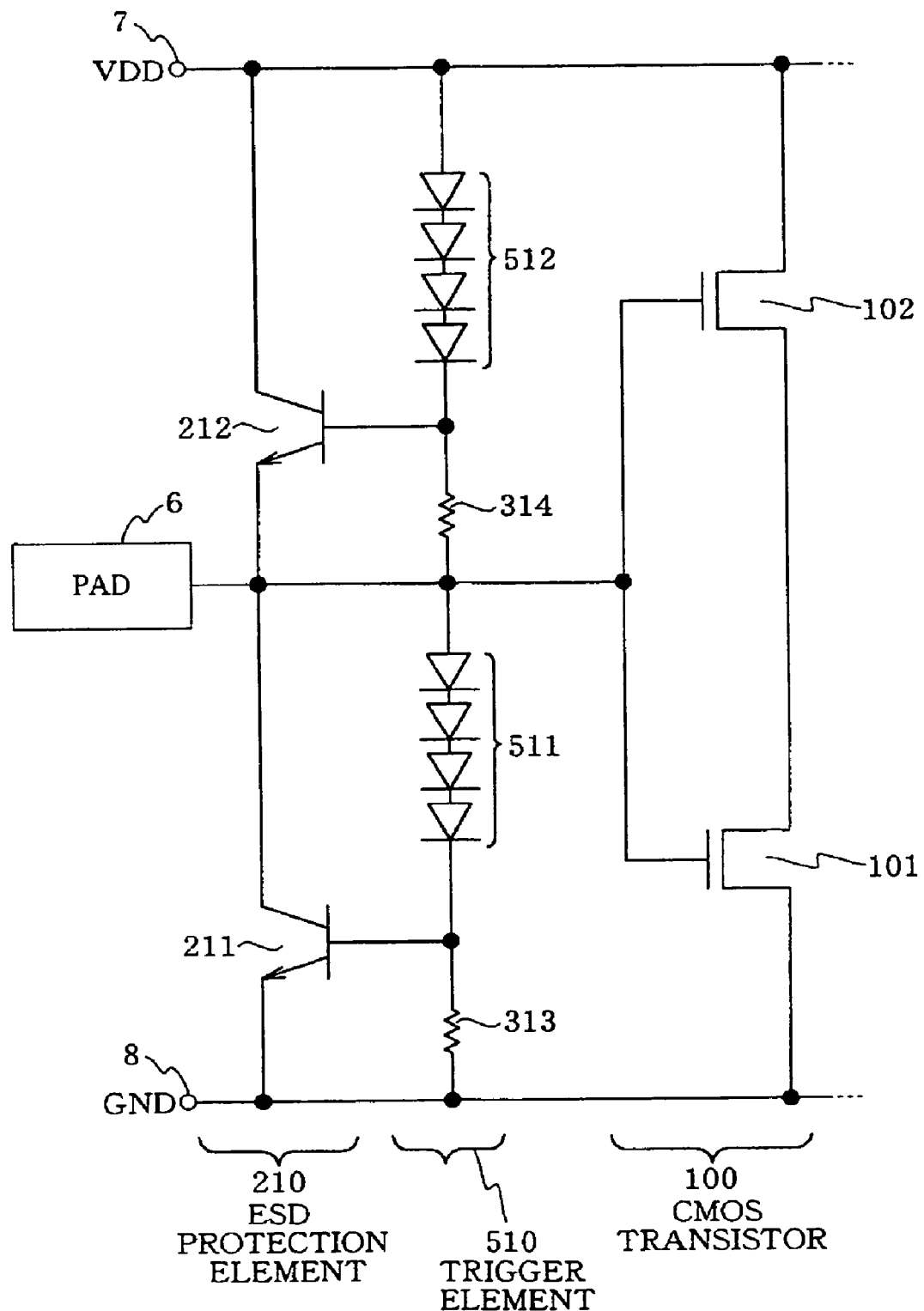
FIG. 26 is a circuit diagram showing a eighth embodiment of the ESD protection apparatus relevant to the present invention.
Figure 27:
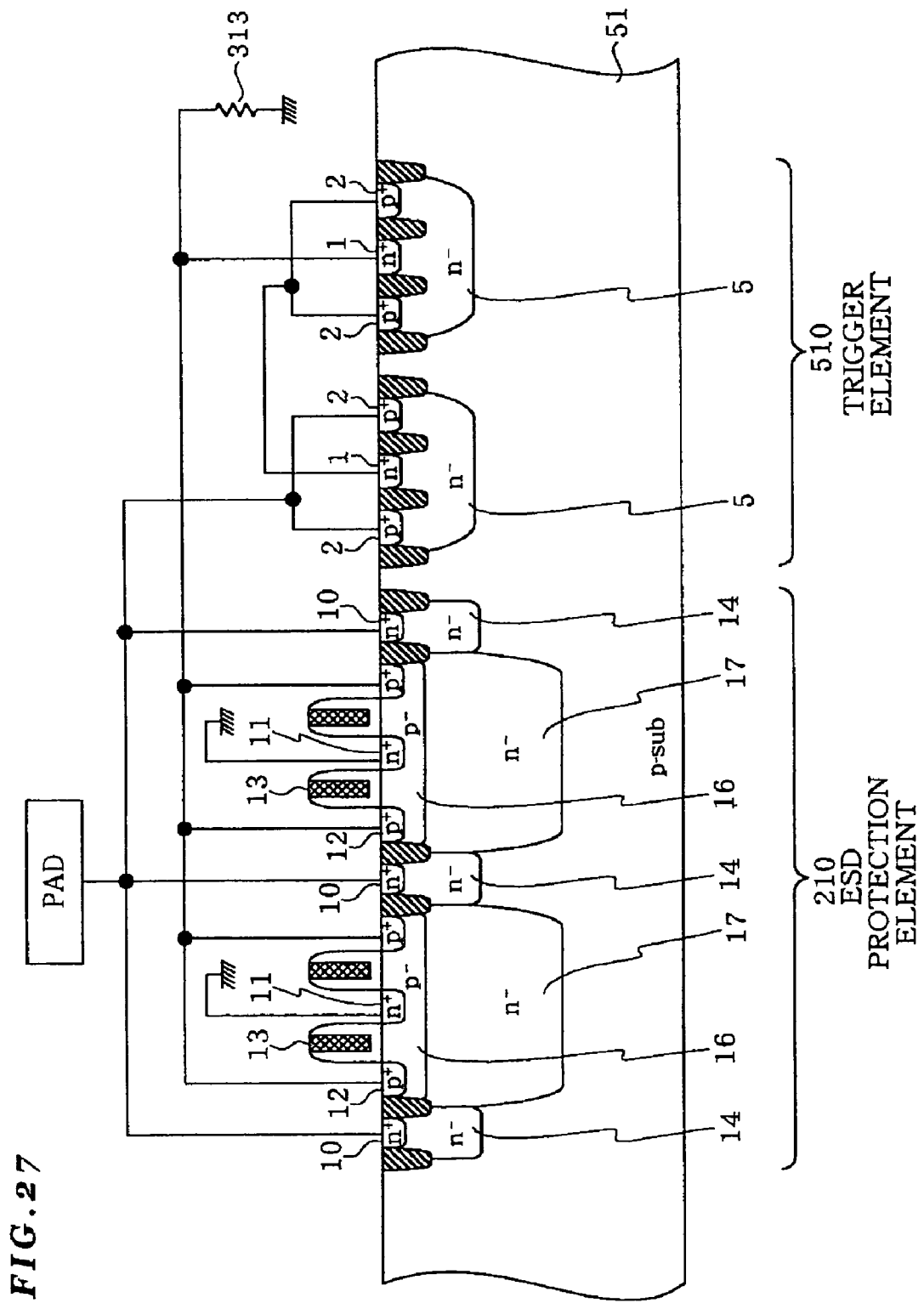
FIG. 27 is a vertical cross-sectional view of the ESD protection apparatus of FIG. 26.

FIG. 26 and FIG. 27 show a eighth embodiment of the ESD protection apparatus relevant to the present invention, FIG. 26 is a circuit diagram and FIG. 27 is a cross-sectional view. Hereinafter, description will be given with reference to these drawings. Parts identical with those in FIGS. 1 and 3 are given the same reference numerals as in FIGS. 1 and 3, and description thereof will be omitted. The ESD protection apparatus of the present embodiment acts as an input buffer protection circuit.

The ESD protection apparatus of the present embodiment is installed between an input terminal (an input pad) 6 of a semiconductor integrated circuit chip and a CMOS transistor 100 and comprises a trigger element 510 comprising diodes 511, 512 which are broken down by overvoltage applied to the input terminal 6 and an ESD protection element 210 comprising vertical bipolar transistors 211, 212 for discharging the accumulated electric charge of the input terminal 6 by being electrically communicated owing to the breakdown of the diodes 511, 512. The diodes 511, 512 are a plurality of diodes connected in series, and the overvoltage is a forward voltage for the diodes 511, 512 and the breakdown is a substantial breakdown by being electrically communicated. Incidentally, the diodes 511, 512 are illustrated in FIG. 26 as four diodes connected in series, but in FIG. 27 simplified and illustrated as two diodes connected in series for convenience's sake.

Regarding the diode 511, a cathode is connected with a base of the vertical bipolar transistor 211 and an anode is connected with the input terminal 6. Regarding the diode 512, the cathode is connected with the base of the vertical bipolar transistor 212 and the anode is connected with an electric power source terminal 7. A resistor 313 is connected between the cathode of the diode 511 and a ground terminal 8. A resistor 314 is connected between the cathode of the diode 512 and the input terminal 6.

The vertical bipolar transistor 211, 212 use the same transistors as those of a first embodiment. The diodes 511, 512 are formed by an N+ diffusion layer 1, a P+ diffusion layer 2 and an N well 5 and the like which are formed at the time of the usual CMOS process.

In the first embodiment, for the trigger element, the breakdown of the inverse diode was utilized. In contrast, in the present embodiment, the trigger element 510 multistage-connected for raising a forward diode equal to or more than an electric power source voltage is employed.

Especially, a low voltage operation device having equal to or less than 1.5V has an extremely thin gate insulation film and therefore is broken down by application of equal to or more than 5V. For realizing low voltage trigger capable of preventing the breakdown of the gate insulation film in this voltage range, the present embodiment is effective. In the present embodiment, by changing serial connection stages of the diode corresponding to the electric power source voltage, a desired trigger voltage can be secured.

Figure 28:
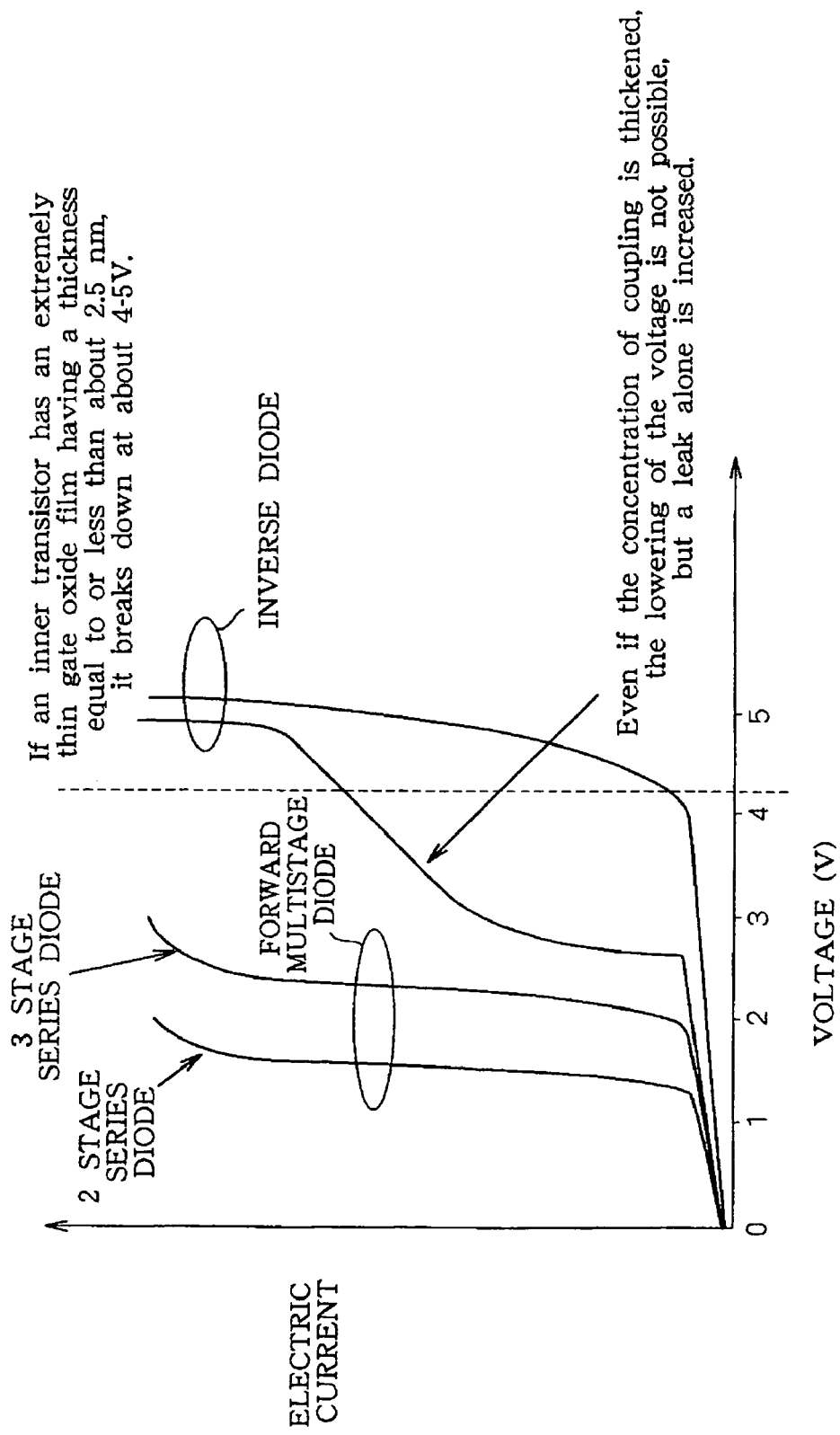
FIG. 28 is a graph showing a comparison result of characteristics of a trigger element using the breakdown of an inverse diode and the trigger element multistage-connecting the forward diodes in series.

FIG. 28 is a graph showing a comparison result of the characteristics of the trigger element utilizing the breakdown of the inverse diode and the trigger element multistage-connecting the forward diodes in series. Hereinafter, description will be given with reference to this illustration.

Regarding utilization of the inverse breakdown, when the triggering at a voltage equal to or less than 5V is to be performed, by thickening the concentration of coupling, the lowering of the voltage to a certain degree is possible. However, before the breakdown, a zener leak is increased, thereby causing a drawback which is an increase of an off leak at the usual LSI operation time. For this reason, the lowering of the breakdown voltage to equal to or more than this is difficult. Hence, by using the trigger element for multistage-connecting the forward diodes and supplying the electric current to the base of the vertical bipolar transistor, the ESD protection element triggering at much lower voltage can be realized.

Figure 29:
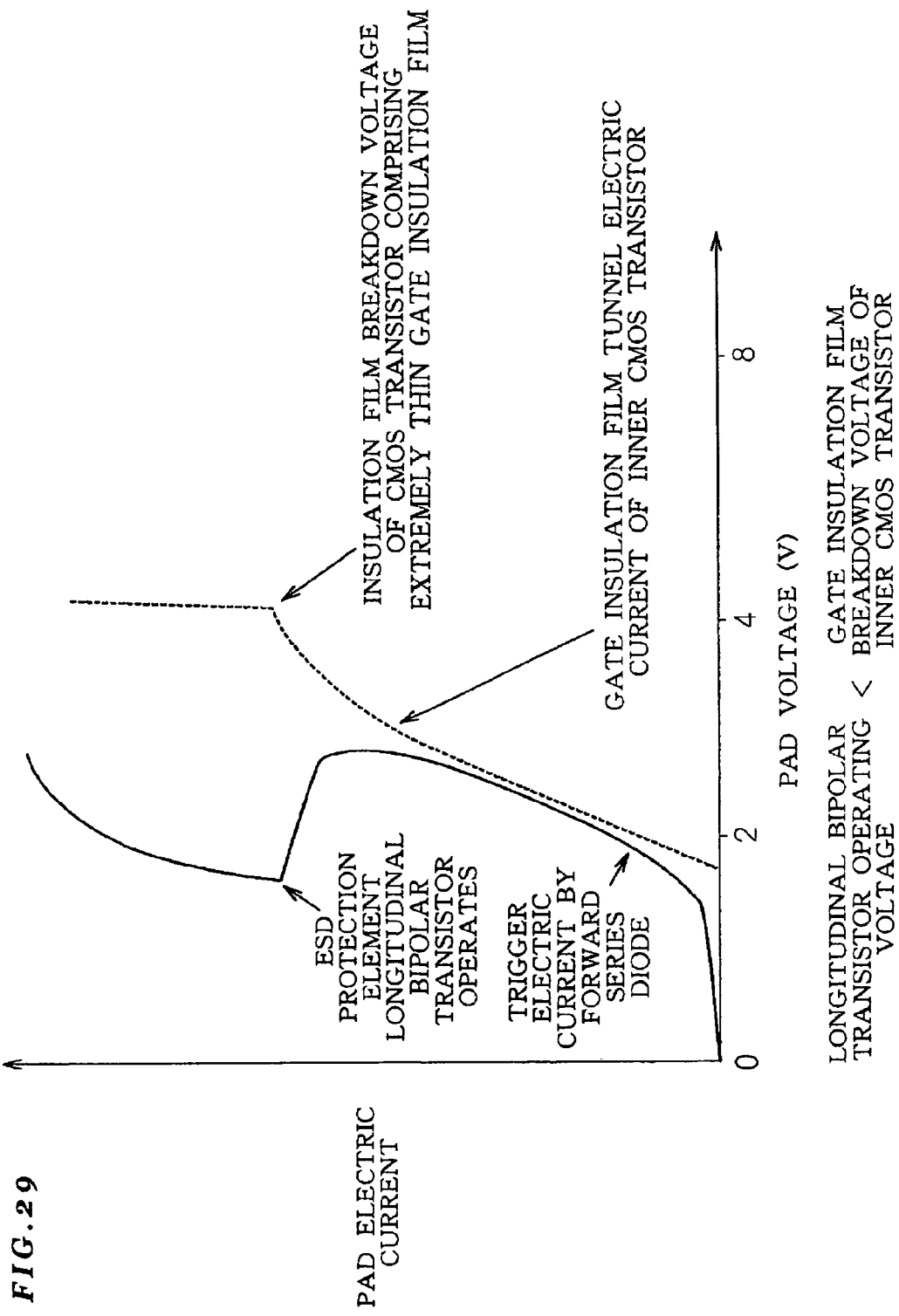
FIG. 29 is a graph showing an electric current voltage characteristic at the time when electrostatic pulses of the ESD are applied to the pad in the ESD protection apparatus of FIG. 26.

FIG. 29 is a graph showing an electric current voltage characteristic when an ESD electrostatic pulse is applied to a pad in the ESD protection apparatus of the present embodiment. Hereinafter, description will be given with reference to this illustration.

If a trigger voltage of one stage portion of the diode is taken as Vf (about 0.6V), the trigger voltage Vf of the diodes of four stages connected in series is Vf.times.4=about 2.4V. When a surge of the ESD is applied to the pad and exceeds 2.4V, the forward series connection diodes are electrically communicated and inject the electric current into the base of the vertical bipolar transistor. By this trigger electric current, the vertical bipolar transistor which is a protection element of a high driving force starts operation, thereby discharging a charge of the ESD.

In recent years, the CMOS device operating at a low voltage of about 1.2V uses an extremely thin gate insulation film having a thickness of about equal to or less than 2.5 nm. The breakdown withstand pressure of this gate insulation film is about 4V to 5V. In such a case, by multistage-connecting the forward diodes in series and setting the triggering voltage in such a manner as to be larger than the electric power voltage of the CMOS inner circuit, no malfunction is caused during actual operation of the LSI and the triggering of the ESD discharge can be performed below the withstand pressure of the gate insulation film.

Figure 30:
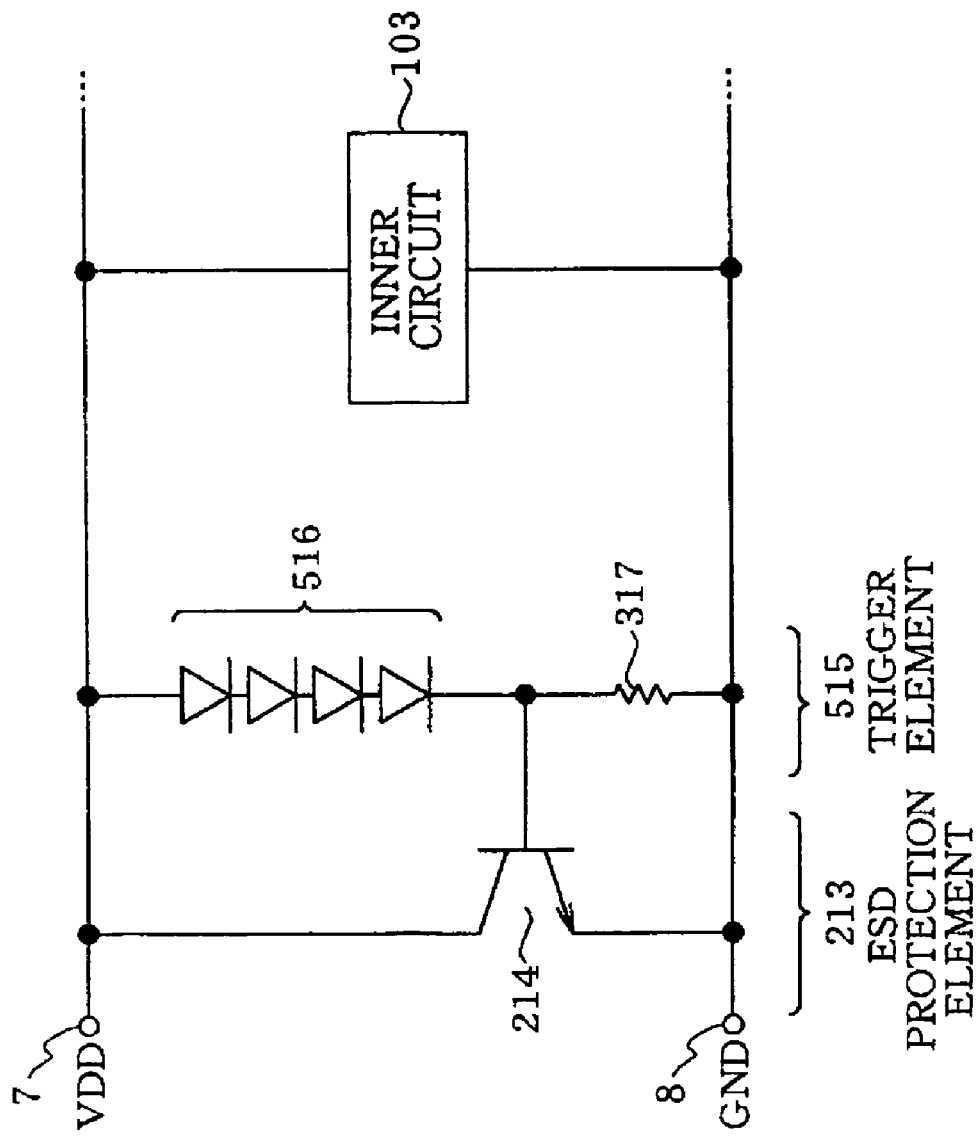
FIG. 30 is a circuit diagram showing a ninth embodiment of the ESD protection apparatus relevant to the present invention.

FIG. 30 is a circuit diagram showing a ninth embodiment of the ESD protection apparatus relevant to the present invention. Hereinafter, description will be given with reference to this illustration. The ESD protection apparatus of the present embodiment acts as an electric power source protection circuit.

The ESD protection apparatus of the present embodiment comprises a trigger element 515 comprising a diode 516 which is provided between the power source terminal 7 and the inner circuit 103 of the semiconductor integrated circuit and is broken down by overvoltage applied to an electric power source terminal 7, and an ESD protection element 213 comprising the vertical bipolar transistor 214 for discharging the accumulated electric charge of the electric power source terminal 7 by being electrically communicated owing to the breakdown of the diode 516. The diode 516 is a plurality of diodes connected in series, and the overvoltage is a forward voltage for the diode 516 and the breakdown is a substantial breakdown by being electrically communicated.

Regarding the diode 516, a cathode is connected with a base of the vertical bipolar transistor 214 and an anode is connected with the electric power source terminal 7. A resistor 317 is connected between the cathode of the diode 516 and a ground terminal 8. A vertical bipolar transistor 214 is of NPN type, and its collector is connected with the electric power source terminal 7, and its emitter is connected with the ground terminal 8.

A cross-sectional view thereof corresponds to FIG. 27. Consequently, the ESD protection apparatus of the present embodiment also performs the same functions and effects as the eighth embodiment.

Figure 31:
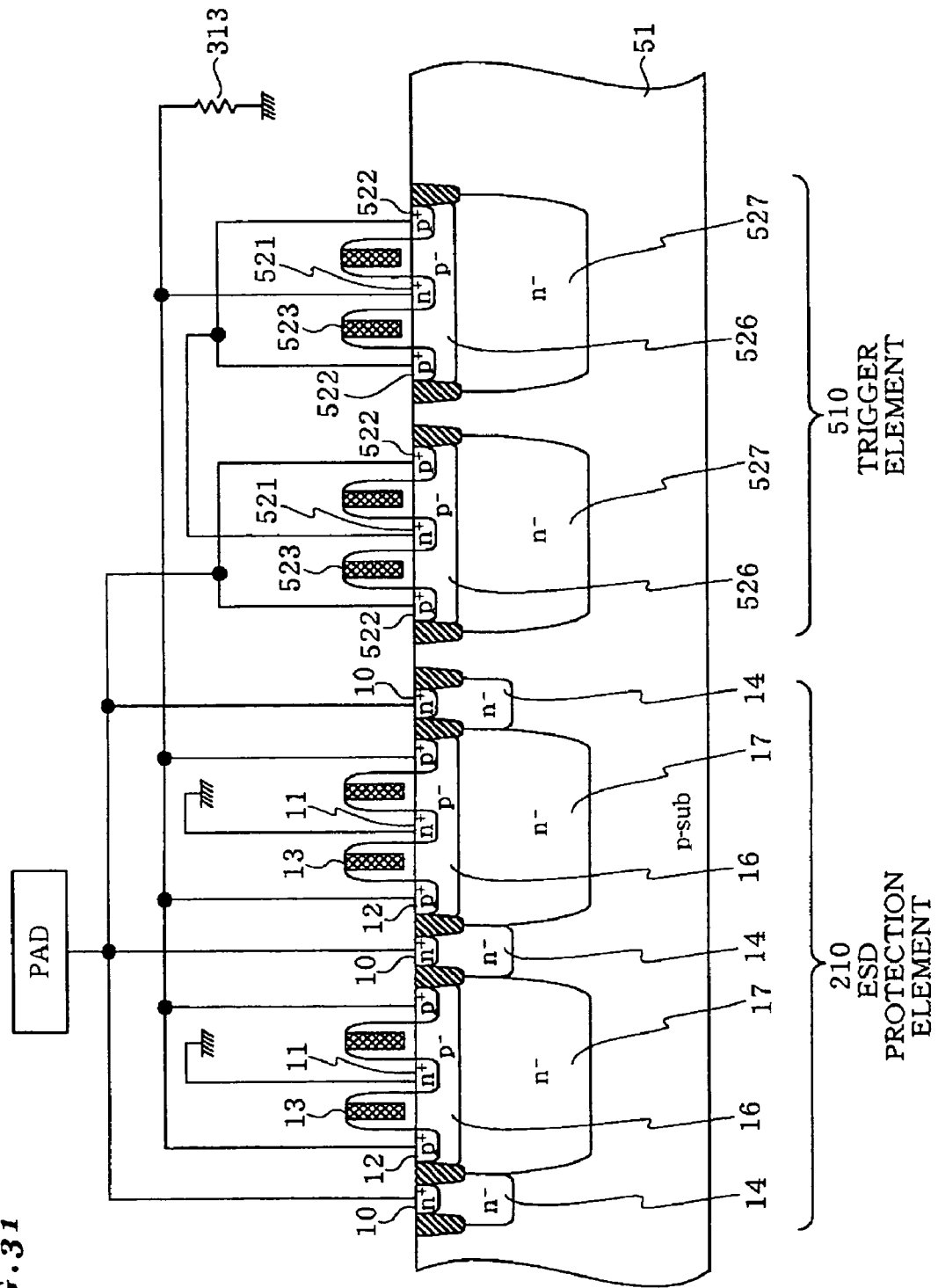
FIG. 31 is a cross-sectional view of a tenth embodiment of the ESD protection apparatus relevant to the present invention.

FIG. 31 is a cross-sectional view showing a tenth embodiment of the ESD protection apparatus relevant to the present invention. Hereinafter, description will be given with reference to the illustration. Incidentally, the circuit diagram of the ESD protection apparatus of the present embodiment is the same as the eighth embodiment (FIG. 26).

In the present embodiment, as a trigger element 510, the diodes simultaneously formed at the time when the vertical bipolar transistor is formed are used by connecting them in series in a forward direction. In the eighth embodiment as shown in FIG. 27, a diode comprising P+ layers 2/an N well 5 is used. In contrast, in the present embodiment, a diode comprising an N+ layer 521/a P− layer 526 formed at the time when the vertical bipolar transistor is formed is used. In a high electric current area at a time such as the ESD charge discharging time, a resistance of a well is dominant and this resistance determines a discharging capacity.

Regarding the diode comprising P+ layers 2/an N well 5 as shown in FIG. 27, the electric current flows under a separation region and therefore a resistance is increased. In contrast to this, in the present embodiment, a separation between the P+ layer 522/the N+ layer 521 is performed by a dummy gate 523 at a formation time of the vertical bipolar transistor, and since adjustment of the concentration of the P− layer 526 is possible by additional injection of the vertical bipolar transistor, the lowering of the resistance at the high electric current area is possible.

In the diode comprising the P+ layers 2/the N well 5 as shown in FIG. 27, since a parasitic vertical bipolar transistor comprising the P+ layer/the N well 5/a P substrate 51 is formed, the electric current flowing into the P substrate 51 is generated. For this reason, the electric current to be supplied to the vertical bipolar transistor which is a protection element is reduced. However, in the present embodiment, since an N well 527 formed simultaneously with a collector layer 17 of an ESD protection element 210 exists, the diode comprising the N+ layer 521/the P− layer 526 can prevent the electric current flowing in a vertical direction, and therefore the electric current can be supplied to the base of the ESD protection element 210 with high efficiency (refer to FIG. 32). Consequently, according to the present embodiment, since a trigger electric current can be supplied to a base of the vertical bipolar transistor with high efficiency, the size of the trigger element can be reduced.

Incidentally, the present invention is, needless to mention, not limited to the foregoing first to the tenth embodiments. For example, the P type may be taken as the N type and the N type may be taken as the P type. Consequently, the NPN type may be taken as the PNP type with each N type and P type taken as the inverse conductive type.

Figure 33B:
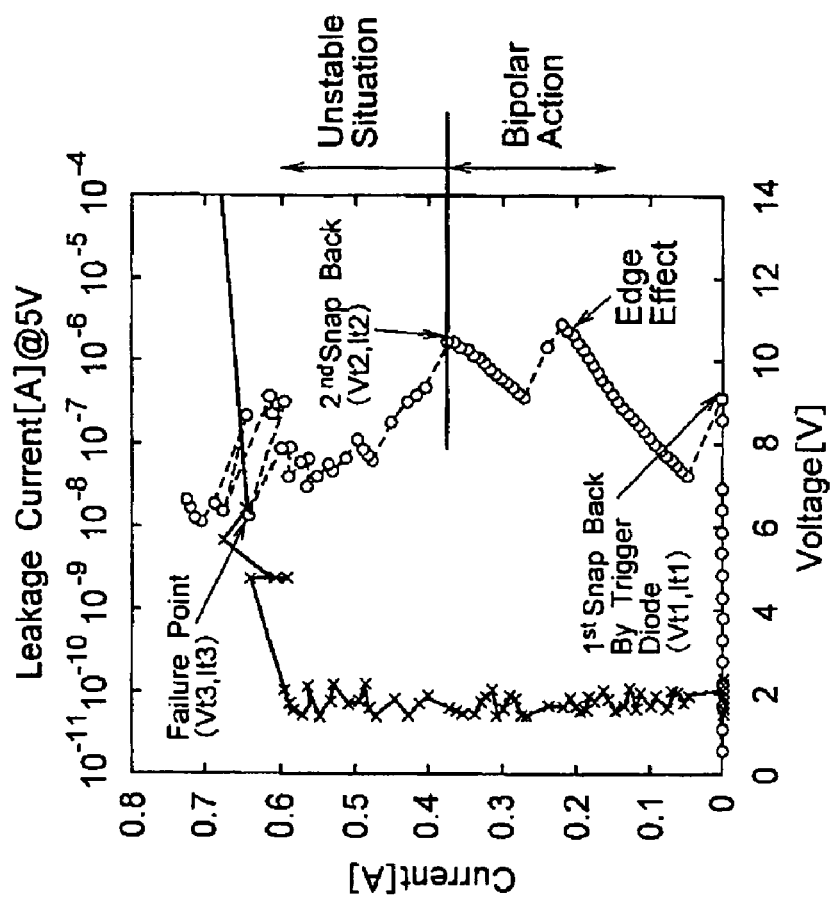
FIG. 33B is a graph illustrating TLP I-V characteristics of the vertical bipolar with the trigger diode.
Figure 33A:
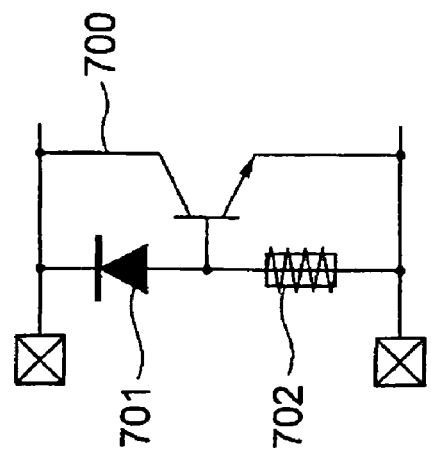
FIG. 33A is a circuit diagram of the vertical bipolar with the trigger diode.

Now, a further improved embodiment will be described. FIG. 33A shows a circuit diagram of the vertical bipolar with the trigger diode, and FIG. 33B shows TLP I-V characteristics of the vertical bipolar with the trigger diode.

In the FIG. 33A, 700 shows a bipolar transistor, 701 shows a diode and 702 shows a resister. In the FIG. 33B, the 1st snapback occurs because the bipolar action began by trigger diode at Vt1 (=9V). During the bipolar action, I-V curve showed discontinuity. This phenomenon is considered to be caused by layout edge effect of vertical bipolar. After this, the 2nd snapback occurred at Vt2 and It2. Then, the devices were damaged at It3. After the 2nd snapback, the protection device became very low resistive and unstable. Therefore, the control of this 2nd snapback is important.

Figure 34B:
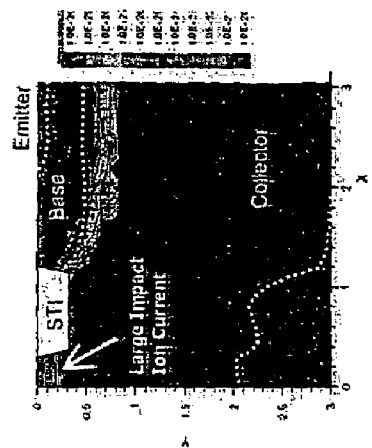
FIGS. 34A, 34B, 34C and 34D are graphs showing the 2nd snapback phenomenon.
Figure 34D:
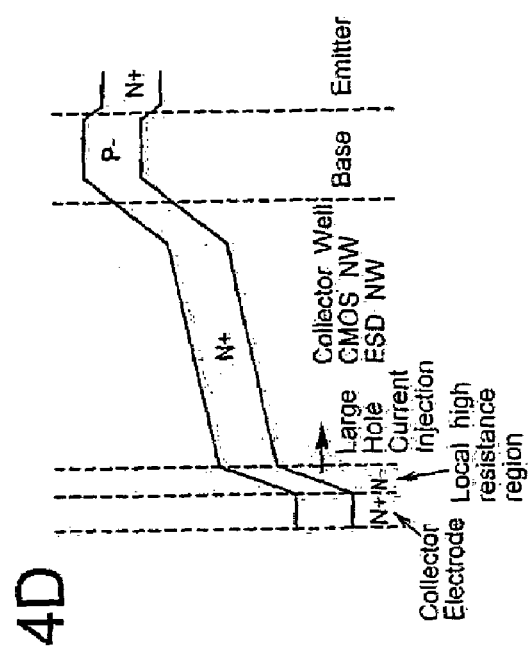
Figure 34A:
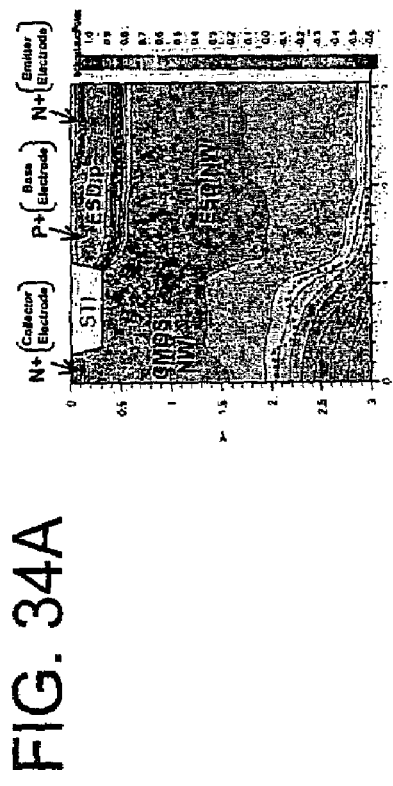
Figure 34C:
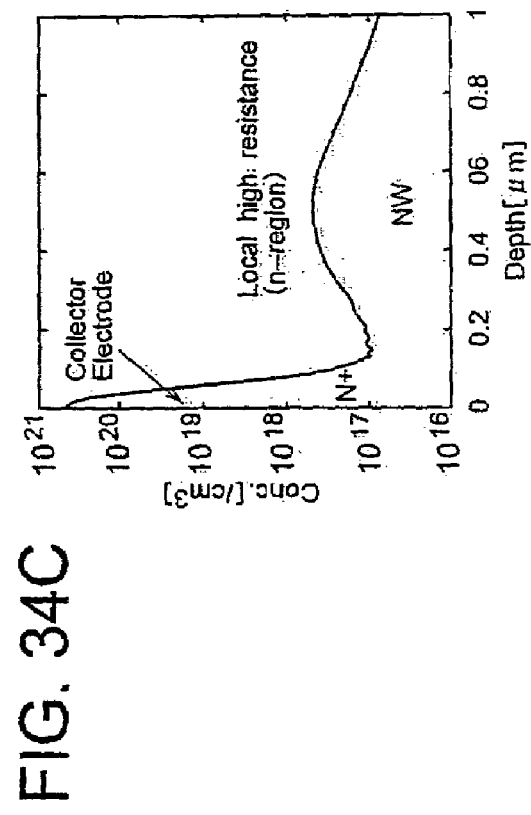

This 2nd snapback phenomenon will be described by referring to FIGS. 34A, 34B, 34C and 34D. FIG. 34A is the structure with which a device simulation was carried out, which shows the emitter, base, and collector sections of the vertical bipolar as the ESD protection element of this embodiment. FIG. 34B shows distribution of the impact ionization degree in the state right before the 2nd snapback during the bipolar action. From this, it can be seen that the impact ionization occurred not only in the base collector junction but also in the area right under the collector electrode ($N^+$). FIG. 34C shows the concentration profile of this region (cross section taken at X=0 of FIG. 34A). A locally low-concentrated N—region is formed between the $N^+$ implantation and NW implantation of the source/drain step of the 130 nm-generation CMOS process that forms the collector electrode. As technology scales, source/drain junction becomes shallow, which is the reason for providing such structure. FIG. 34D shows the energy band in the state where a high electric current is flown during the bipolar action. Since there is a locally low-concentrated region, a large electric field is generated in that region and impact ionization is caused thereby. This impact ionization causes breakdown, which lowers the resistance of the collector. This is the cause of the 2nd snapback. This phenomenon is disclosed in the contents of non-patent literature "Avalanche Injection and Second Breakdown in Transistors". Since the resistance of the collector region is lowered, the electric current is concentrated, thereby generating an unstable condition. A thermal breakdown is therefore caused at last.

That is, the 2nd snapback is caused because there is generated an avalanche breakdown in the locally high resistive N type region that is right under the collector electrode.

In order to overcome this issue, this embodiment employs the structure that alleviates the electric field at the time of high electric current through carrying out additional implantation to the locally high resistive region that is right under the collector electrode.

Figure 35:
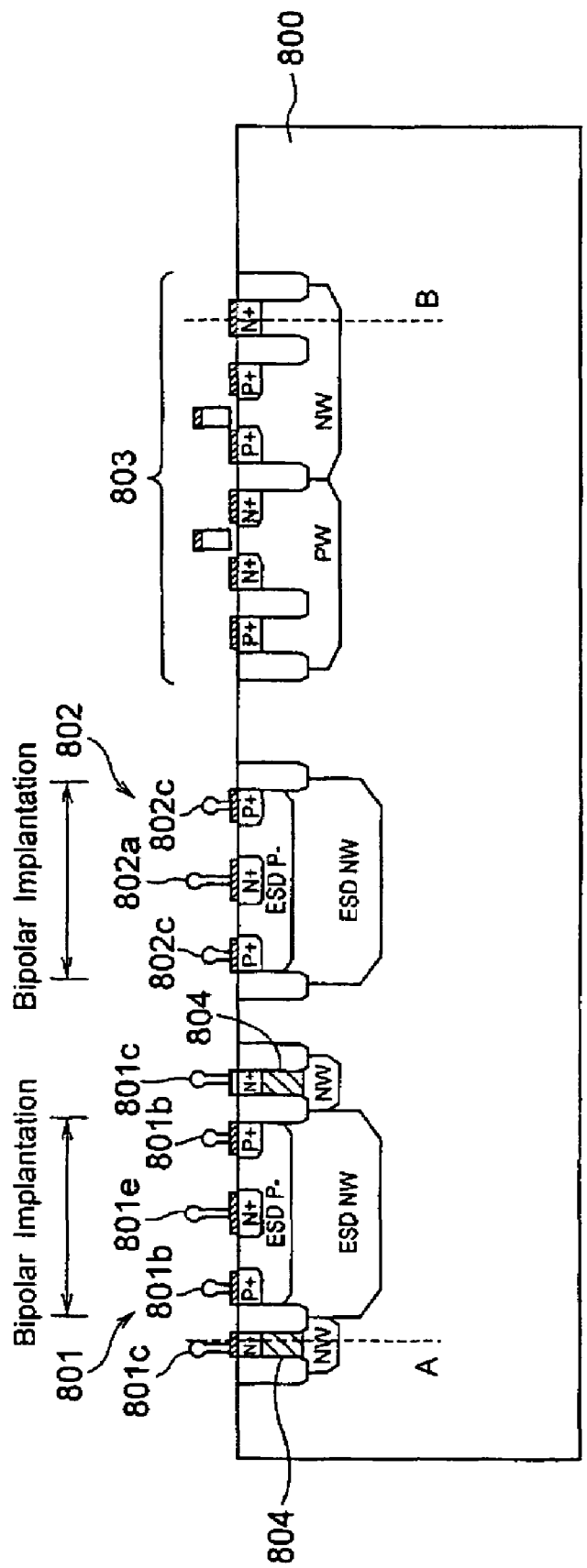
FIG. 35 is a cross sectional view showing a vertical bipolar, trigger diode and CMOS transistor.

In the FIG. 35, 800 is a $P^+$ Substrate, 801 is an ESD protection element (vertical bipolar), 802 is a trigger element (diode), and 803 is a CMOS transistor. 801b is a base of the vertical bipolar transistor 801, 801e is an emitter of the vertical bipolar transistor 801, and 801c is a collector of the vertical bipolar transistor. 802a is a cathode of the diode 802, and 802c is an anode of the diode.

We studied improvement of collector structure to alleviate the 2nd snapback. To investigate relaxing effect of the local high resistance 804 of the under side of $N^+$ electrode (collector 801c), three structures were fabricated using other available implantation of our CMOS process, such as LDD/n-well implantation of other embedded transistors (FIG. 35).

In the recent CMOS LSI, it is common to mount a plurality of transistors in the same LSI. Thus, there already exist a plurality of NW forming steps and LDD forming steps in the process. Through utilizing those steps, the additional implantation thereby requires no additional mask step.

This additional implantation is necessary for the ESD protection element 801 part of this embodiment where a high electric current is flown and a high electric field is generated, though it is not necessary in the NW contact region (cross section B) of the Pch region of the CMOS 803 shown in FIG. 35. Since the NW contact region is a minute region, additional implantation of LDD and NW to the NW contact region of the Pch region of the CMOS 803 by using a mask for forming the wide regions such as LDD and NW causes an increase in the area of the CMOS region. This deteriorates the area efficiency.

Now, the improved effects of this embodiment will be described.

Figure 36:
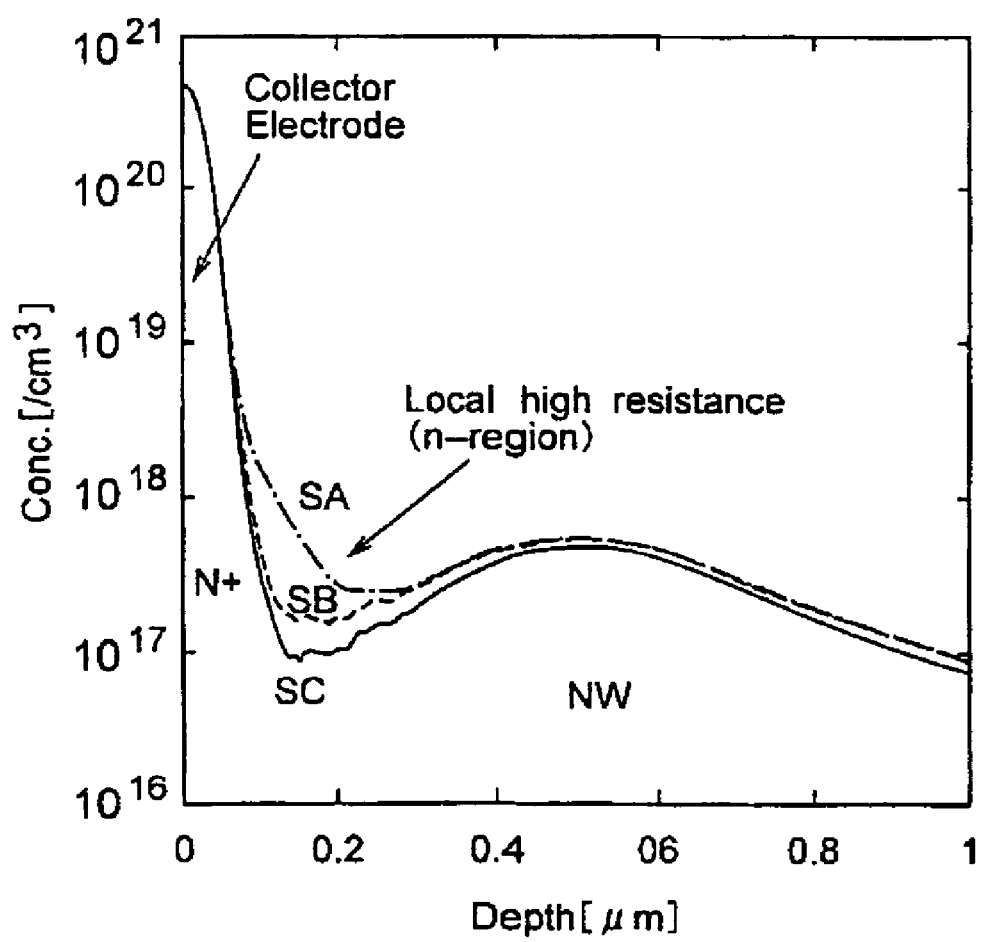
FIG. 36 is a graph showing concentration doping profiles of three structures in the direction vertical to the $n^+$ electrode.

FIG. 36 shows concentration doping profiles of three structures in the direction vertical to the n+electrode. SC indicates concentration doping profiles in cross section B of FIG. 35. SA and SB indicate concentration doping profiles in cross section A of FIG. 35. The SA type shows the smallest local resistance.

Figure 37:
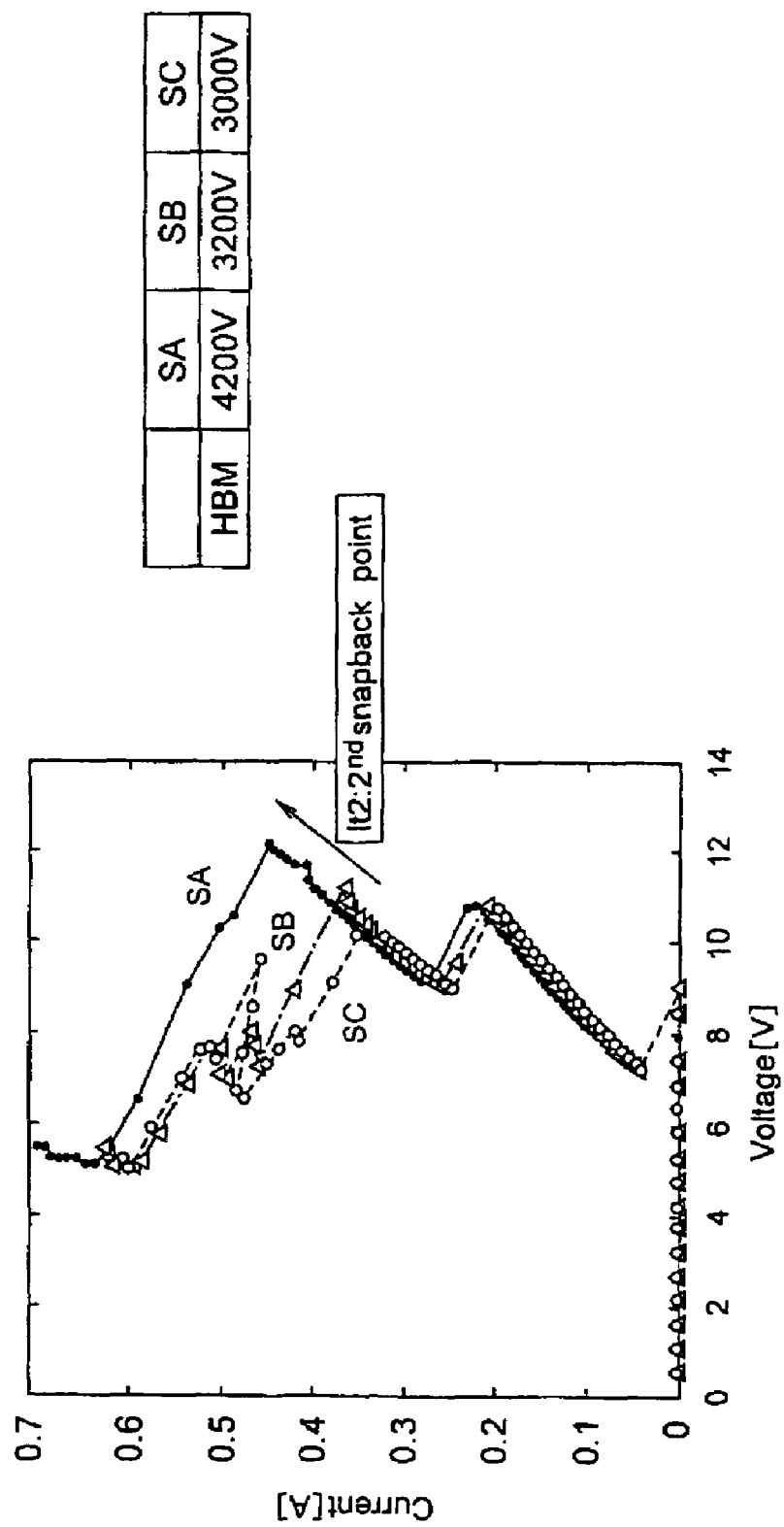
FIG. 37 is a graph showing a result of I-V characteristics and a chart showing HBM test results of three structures.
Figure 38:
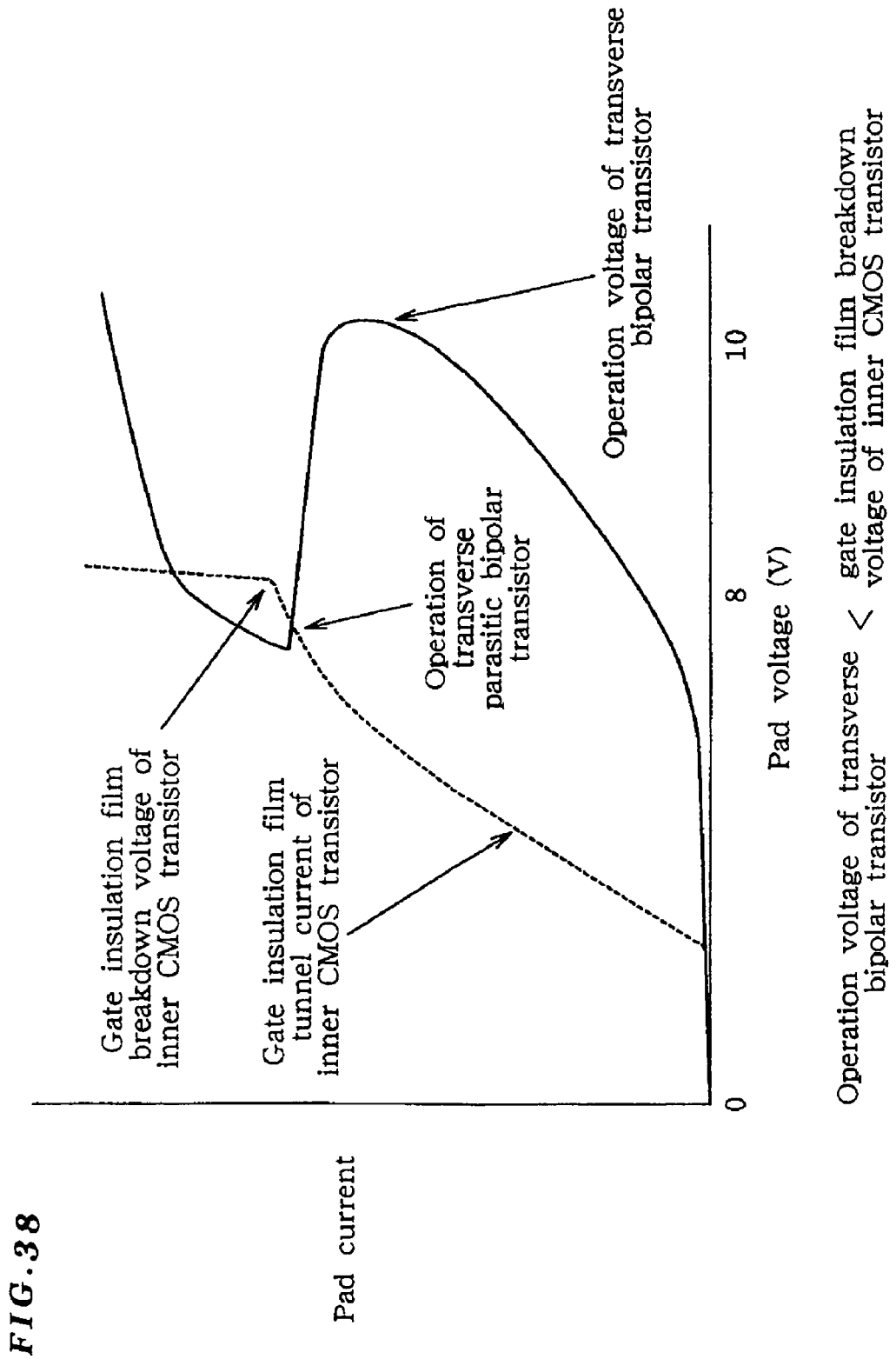
FIG. 38 is a graph showing the voltage-ampere characteristic in case of applying electrostatic pulses of ESD of a pad in a conventional technique.

It2 (the electric current with which the 2nd snapback occurs) of ESD protection circuits with vertical bipolar devices and the trigger diode can also be improved as shown in FIG. 37. By the use of the structure (SA) of this embodiment, the electric current value that causes the 2nd snapback is improved, thereby achieving a still higher capacity as the ESD protection element. Furthermore, the improved effect was also observed with HBM (Human Body Model) test that is one of the ESD test standards.

In an ESD protection apparatus of the present invention, since the breakdown voltage of a diode is used as a trigger of a vertical bipolar transistor, electric current concentration and electric field concentration are hardly caused in junction parts even if miniaturization is promoted and moreover the characteristic of triggering at a low voltage can be obtained. The method for fabricating an ESD protection apparatus of the present invention is make it easy to fabricate an ESD protection apparatus of the present invention by adding only one mask in a common CMOS process.

In other words, the effects of the present invention are as follows. The first effect is that since electric current is flowed in the vertical direction by employing a vertical bipolar transistor, electric current concentration is suppressed as compared with the case of releasing the electric current in the transverse direction by using a conventional CMOSFET type parasitic bipolar transistor and consequently the ESD protection element itself is hardly broken. The second effect is that since the electric current to be discharged for the same surface area is high, the surface area required for an ESD protection element can be miniaturized and consequently decrease of the input capacity necessary for high-speed operation can be performed. The third effect is that since a vertical bipolar transistor and a trigger element can be formed by adding only one ion implantation mask for an ESD protection circuit in a common CMOSFET process, the fabrication method is carried out in a compatible process with the CMOSFET process. The fourth effect is that owing to the trigger element capable of working a low voltage, the breakdown of the gate insulation film in CMOSFET can be prevented. The fifth effect is that an element capable of triggering at a desired voltage can be form.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims as therefore intended to be embraced therein.

What is claimed is:

1. A method of fabricating a semiconductor integrated circuit device comprising the steps of:
   (a) within a substrate layer, simultaneously forming a first conductivity type well of a second conductivity type MOS transistor for an inner circuit and a first conductivity type collector connection well to be connected with a collector of a vertical bipolar transistor on a second conductivity type semiconductor substrate;
   (b) using ion implantation into the substrate layer, forming a first conductivity type collector well to be a collector of said vertical bipolar transistor;
   (c) using ion implantation into the substrate layer, forming a second conductivity type layer to be a base in the first conductivity type collector well of said vertical bipolar transistor;
   (d) using ion implantation into the substrate layer, simultaneously forming a first conductivity type layer to be a collector connection in the first conductivity type collector connection well of said vertical bipolar transistor, and a first conductivity type layer to be an emitter in the second conductivity type layer of said vertical bipolar transistor;
   (e) using ion implantation into the substrate layer, simultaneously forming a second conductivity type source/drain layer on the first conductivity type well of said second conductivity type MOS transistor, and a second conductivity type base contact layer on the second conductivity type layer of said vertical bipolar transistor; and
   (f) using ion implantation into the substrate layer, forming a first conductivity type layer between said first conductivity type collector connection well and said first conductivity type layer to be a collector connection so as to alleviate a high intensity of electric field between said first conductivity type collector connection well and said first conductivity layer collector connection.

2. The method of fabricating a semiconductor integrated circuit device as claimed in claim 1, wherein said second conductivity type MOS transistor is a PMOS transistor, and said vertical bipolar transistor is a vertical NPN transistor.

3. The method of fabricating a semiconductor integrated circuit device as claimed in claim 1, further comprising:
   (g) using ion implantation into the substrate layer, forming a second conductivity type well of a first conductivity type MOS transistor for said inner circuit,
   wherein step (d) further comprises simultaneously forming a first conductivity type layer on the second conductivity type well of said first conductivity type MOS transistor.

4. The method of fabricating a semiconductor integrated circuit device as claimed in claim 1, wherein steps (b) and (c) use a same mask for successive ion implantations to form the first conductivity type collector well to be a collector of said vertical bipolar transistor and the second conductivity type layer to be a base in the first conductivity type collector well of said vertical bipolar transistor.

5. The method of claim 4, wherein, the first conductivity type layer between said first conductivity type collector connection well and said first conductivity type layer formed to be the collector connection in step (f) so as to alleviate a high intensity of electric field between said first conductivity type collector connection well and said first conductivity layer collector connection, is a high resistance relative to said first conductivity type collector connection well and said first conductivity type layer formed to be the collector connection.

6. The method of claim 1, wherein, the first conductivity type layer between said first conductivity type collector connection well and said first conductivity type layer formed to be the collector connection in step (f) so as to alleviate a high intensity of electric field between said first conductivity type collector connection well and said first conductivity layer collector connection, is a high resistance relative to said first conductivity type collector connection well and said first conductivity type layer formed to be the collector connection.

7. A method of fabricating a semiconductor integrated circuit device according to the present invention comprises the sequential steps of:
   a) simultaneously forming an $N^-$ type well (5) of a MOS transistor comprising an inner circuit and an $N^-$ type well for collector connection (14) to be connected with a collector of a vertical bipolar transistor on a P type semiconductor substrate;
   b) using a first mask, by ion implantation simultaneously forming a collector $N^-$ type well to be a collector (17) of said vertical bipolar transistor and an $N^-$ type well of a diode (27) on said P type semiconductor substrate;
   c) using the first mask, by ion implantation simultaneously forming a $P^-$ type layer (16) to be a base in the collector $N^-$ type well of said vertical bipolar transistor and a $P^-$ type layer (26) to be an anode in the $N^-$ type well of said diode;
   d) by ion implantation, simultaneously forming an $N^+$ type layer (10) in the $N^-$ type well for collector connection of said vertical bipolar transistor, an $N^+$ type layer (11) to be an emitter in the $P^-$ type layer of said vertical bipolar transistor, and an $N^+$ type layer (21) to be a cathode in the $P^-$ type layer of said diode;
   e) by ion implantation, simultaneously forming a $P^+$ type layer (2) on the $N^-$ type well (5) of said MOS transistor, a $P^+$ type layer (12) on the $P^-$ type layer of said vertical bipolar transistor, and a $P^+$ type layer (22) on the $P^-$ type layer of said diode; and
   f) by ion implantation, forming an N type layer (804) between said $N^-$ type collector connection well (14) and said $N^+$ type layer to be a collector connection (10) so as to alleviate a high intensity of electric field between said first conductivity type collector connection well and said first conductivity layer collector connection.

8. The method of claim 7, wherein, the N type layer (804) between said $N^-$ type collector connection well (14) and said $N^+$ type layer to be a collector connection (10) is a high resistance relative to said $N^-$ type collector connection well (14) and said $N^+$ type layer to be a collector connection (10).

9. A method for fabricating a semiconductor integrated circuit comprising:
   a first step of simultaneously forming an $N^-$ type well (5) of a first MOS transistor (102) comprising an inner circuit and an $N^-$ type well (14) for collector connection to be connected with a collector of a vertical bipolar transistor on a P type silicon substrate;

a second step of simultaneously forming a collector N⁻ type well (17) to be a collector of said vertical bipolar transistor and an N⁻ type well (27) of a diode on said P type silicon substrate;

a third step of simultaneously forming a P⁻ type layer (16) to be a base in the collector N⁻ type well (17) of said vertical bipolar transistor and a P⁻ type layer (26) to be an anode in the N⁻ type well (27) of said diode;

a fourth step of simultaneously forming an N⁺ type (1) layer in a P⁻ type well (4) of a second MOS transistor (101), an N³⁰ type layer (10) collector connection in the N⁻ type collector connection well (14) of said vertical bipolar transistor, an N⁺ type layer (11) to be an emitter in the P⁻ type layer (16) of said vertical bipolar transistor, and an N⁺ type layer (21) to be a cathode in the P⁻ type layer of said diode; and a fifth step of simultaneously forming a P⁺ type layer (2) on the N⁻ type well (5) of said first MOS transistor (102), a P⁺ type layer (12) on the P⁻ type layer of said vertical bipolar transistor, and a P⁺ type layer (22) on the P⁻ type layer of said diode; and a sixth step of forming an N type layer between said N⁻ type collector connection well (14) of said vertical bipolar transistor and said N⁺ type layer (10) collector connection so as to alleviate a high intensity of electric field between said N⁻ type collector connection well (14) and said N⁺ type layer (10) collector connection.

10. The method for fabricating the semiconductor integrated circuit according to claim 9, further comprising a step of forming a dummy gate electrode simultaneously with a gate electrode of said first MOS transistor in the region where the collector N⁻ type well of said vertical bipolar transistor and N⁻ type well of said diode are formed in said second step, wherein said dummy gate electrode is to prevent connection in the subsequent steps between the N⁺ type layers of said vertical bipolar transistor and said diode formed in said fourth step and the P⁺ type layers of said vertical bipolar transistor and said diode formed in the fifth step.

11. The method for fabricating the semiconductor integrated circuit according to claim 9, further comprising a step of forming an insulation layer which prevents connection in the subsequent steps between the N⁺ type layers of said vertical bipolar transistor and said diode formed in said fourth step and the P⁺ type layers of said vertical bipolar transistor and said diode formed in the fifth step.

12. The method for fabricating the semiconductor integrated circuit according to claim 9, wherein an N replaces said conductive type P and a P replaces said conductive type N.

13. A method for fabricating a semiconductor integrated circuit comprising:

a first step of simultaneously forming an N⁻ type well of a first MOS transistor constituting an inner circuit and an N⁻ type well for collector connection to be connected with a vertical bipolar transistor on a P type silicon substrate;

a second step of simultaneously forming a collector N⁻ type well to be a collector of said vertical bipolar transistor and an N⁻ type well of a diode on said P type silicon substrate;

a third step of simultaneously forming a P⁻ type layer to be a base in the collector N⁻ type well of said vertical bipolar transistor and a P⁻ type layer to be a cathode in the N⁻ type well of said diode;

a fourth step of simultaneously forming an N⁺ layer in a P⁻ type well of a second MOS transistor, an N⁺ layer in the N⁻ type well for collector connection of said vertical bipolar transistor, an N⁺ layer to be an emitter in the P⁻ type layer of said vertical bipolar transistor, and an N⁺ layer to be an anode in the P⁻ type layer of said diode;

a fifth step of simultaneously forming a P⁺ layer in the N⁻ type well of said first MOS transistor, a P⁺ layer in the P⁻ type layer of said vertical bipolar transistor and a P⁺ layer in the P⁻ type layer of said diode; and a sixth step of forming an N type layer between said N⁻ type collector connection well (14) of said vertical bipolar transistor and said N⁺ type layer (10) collector connection so as to alleviate a high intensity of electric field between said N⁻ type collector connection well (14) and said N⁺ type layer (10) collector connection.

* * * * *